United States Patent
Gorny et al.

(10) Patent No.: US 11,688,409 B2
(45) Date of Patent: *Jun. 27, 2023

(54) MULTI-BAND NOISE GATE

(71) Applicant: GoPro, Inc., San Mateo, CA (US)

(72) Inventors: Joyce Gorny, Mountain View, CA (US); Erich Tisch, San Francisco, CA (US); Per Magnus Fredrik Hansson, Los Altos, CA (US)

(73) Assignee: GoPro, Inc., San Mateo, CA (US)

( * ) Notice: Subject to any disclaimer, the term of this patent is extended or adjusted under 35 U.S.C. 154(b) by 149 days.

This patent is subject to a terminal disclaimer.

(21) Appl. No.: 17/093,223

(22) Filed: Nov. 9, 2020

(65) Prior Publication Data
US 2021/0142811 A1    May 13, 2021

Related U.S. Application Data

(63) Continuation of application No. 15/934,392, filed on Mar. 23, 2018, now Pat. No. 10,861,473.
(Continued)

(51) Int. Cl.
*G10L 19/02*    (2013.01)
*G10L 19/18*    (2013.01)
(Continued)

(52) U.S. Cl.
CPC .......... *G10L 19/0208* (2013.01); *G10L 19/18* (2013.01); *G10L 21/0232* (2013.01);
(Continued)

(58) Field of Classification Search
CPC . G10L 19/0208; G10L 19/18; G10L 21/0232; G10L 21/0316; H03G 3/30; H03G 9/005; H03G 9/025
See application file for complete search history.

(56) References Cited

U.S. PATENT DOCUMENTS

| | | | |
|---|---|---|---|
| 5,416,847 A | 5/1995 | Boze | |
| 5,694,436 A * | 12/1997 | Huang | H04B 3/54 |
| | | | 340/310.14 |
| 7,245,893 B1 * | 7/2007 | Husted | H03G 3/3078 |
| | | | 375/345 |
| 8,903,109 B2 | 12/2014 | Vickers | |

(Continued)

FOREIGN PATENT DOCUMENTS

JP        4509413 B2 *  7/2010

OTHER PUBLICATIONS

Google English Machine Translation of JP 4509413B2 (Year: 2010).*

*Primary Examiner* — Michelle M Koeth
(74) *Attorney, Agent, or Firm* — Young Basile Hanlon & MacFarlane, P.C.

(57) ABSTRACT

The present disclosure relates to processing a plurality of audio signals. A device receives the plurality of audio signals in the frequency domain and determining an overall attenuation multiplier based on the plurality of audio signals and an overall lookup table that relates decibel values to different overall attenuation multipliers. The device determines an attenuation vector comprising a plurality of bin-specific attenuation multipliers, each bin-specific attenuation multiplier respectively corresponding to a different frequency bin of the plurality of frequency bins. The device scales each bin-specific attenuation value in the attenuation vector with the overall attenuation multiplier, and edits each of the audio signals based on the scaled bin-specific attenuation values in the attenuation vector.

20 Claims, 12 Drawing Sheets

Related U.S. Application Data

(60) Provisional application No. 62/563,731, filed on Sep. 27, 2017.

(51) Int. Cl.
*H03G 9/00* (2006.01)
*H03G 9/02* (2006.01)
*G10L 21/0232* (2013.01)
*G10L 21/0316* (2013.01)
*H03G 3/30* (2006.01)

(52) U.S. Cl.
CPC ............... *H03G 3/30* (2013.01); *H03G 9/005* (2013.01); *H03G 9/025* (2013.01); *G10L 21/0316* (2013.01)

(56) References Cited

U.S. PATENT DOCUMENTS

| | | | |
|---|---|---|---|
| 9,100,735 B1 | 8/2015 | Taenzer | |
| 9,635,459 B2 | 4/2017 | Jung | |
| 9,647,624 B2* | 5/2017 | Li | H03G 9/005 |
| 2002/0051546 A1* | 5/2002 | Bizjak | H03G 3/3089 |
| | | | 381/106 |
| 2006/0013422 A1 | 1/2006 | Goorevich | |
| 2015/0205571 A1* | 7/2015 | Duwenhorst | G11B 27/031 |
| | | | 700/94 |
| 2015/0350783 A1* | 12/2015 | Krishnaswamy | H04R 3/007 |
| | | | 381/55 |
| 2016/0197590 A1* | 7/2016 | Koppens | H03G 3/3005 |
| | | | 381/106 |
| 2017/0111737 A1* | 4/2017 | Painter | H04R 3/002 |

\* cited by examiner

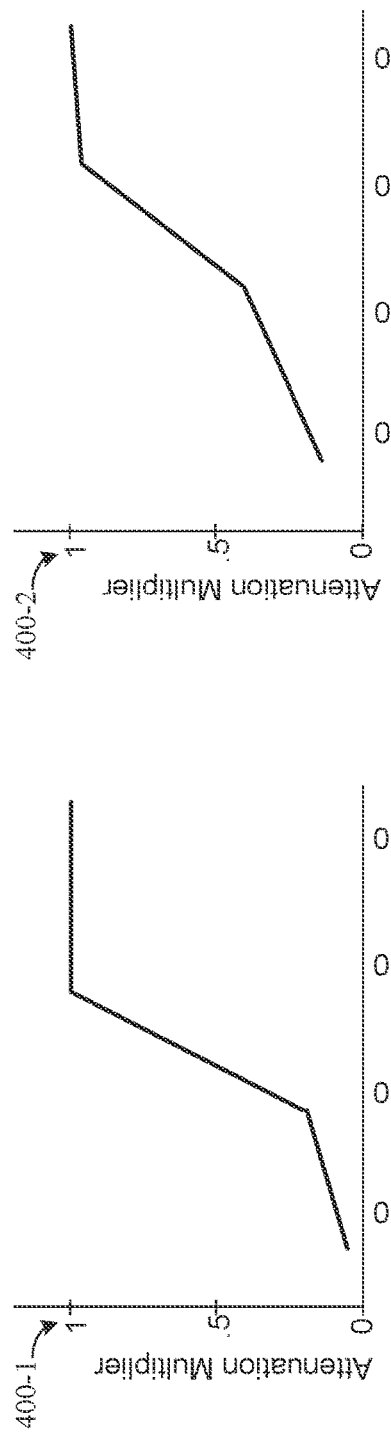
FIG. 4A
FIG. 4B
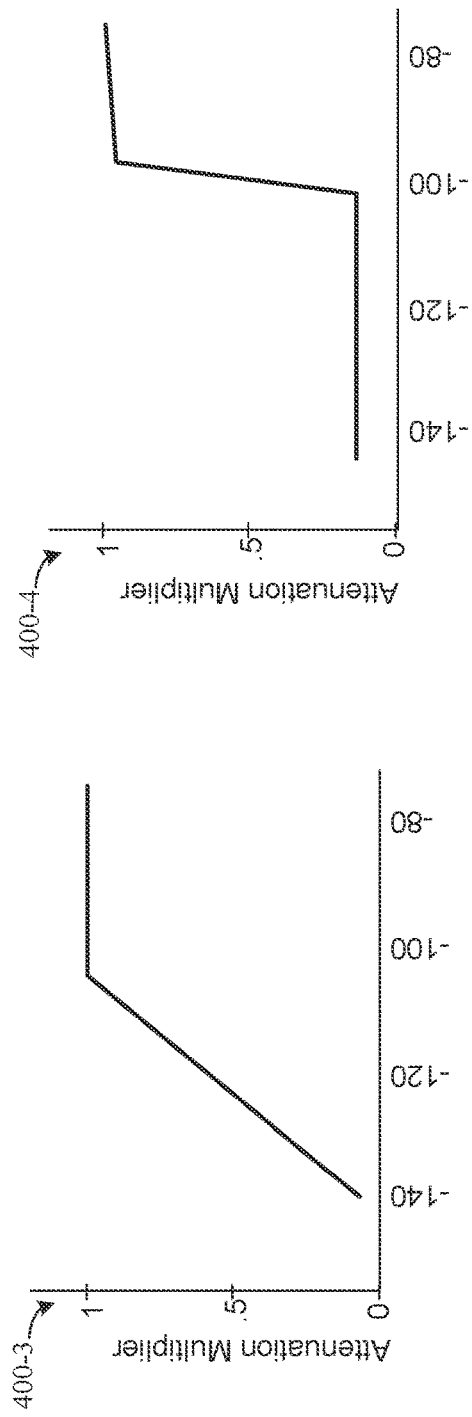
FIG. 4C
FIG. 4D

MULTI-BAND NOISE GATE

CROSS-REFERENCE TO RELATED APPLICATION

This application is a continuation of U.S. application Ser. No. 15/934,392, filed Mar. 23, 2018, which claims priority to and the benefit of U.S. Provisional Application Ser. No. 62/563,731, filed Sep. 27, 2017, the entire disclosures of which are hereby incorporated by reference.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

TECHNICAL FIELD

The present disclosure relates to audio signal processing. In particular, the disclosure relates to a multi-band noise gate.

BACKGROUND

Image capture devices, such as cameras, may capture content, including audio. The image capturing device may include one or more audio recording systems, such as microphones, that capture audio signals. One common issue that arises in recorded audio signals is a noise floor. The noise floor is the portion of an audio signal that is created from the collection of noise sources and unwanted signals within the audio capturing system. The noise floor may be difficult to filter using traditional filters, as the noise floor may be typically observed across many frequencies within the system.

SUMMARY

The present disclosure satisfies the foregoing needs by providing, inter alia, devices and methods for processing a plurality of audio signals. The device may be configured to receive the plurality of audio signals in a frequency domain. Each audio signal is captured by a respective audio recording device and transformed from a time domain to the frequency domain. The frequency domain is divided into a plurality of frequency bins that collectively span the frequency domain, and each audio signal is represented by a plurality of magnitudes respectively corresponding to the plurality of frequency bins of the frequency domain. Each magnitude represents a magnitude of the audio signal at the corresponding frequency bin. The device may be configured to determine an overall attenuation multiplier based on the plurality of audio signals and an overall lookup table that relates decibel values to different overall attenuation multipliers. The device may be configured to determine an attenuation vector comprising a plurality of bin-specific attenuation multipliers, each bin-specific attenuation multiplier respectively corresponding to a different frequency bin of the plurality of frequency bins. Determining the attenuation vector includes separating the plurality of audio signals into a plurality of frequency bands. The plurality of frequency bands collectively span the frequency domain and each respective band is spanned by two or more frequency bins of the plurality of the frequency bins. The device may be configured, for each respective frequency band, to obtain a band-specific lookup table from a plurality of band-specific lookup tables. The band-specific lookup table corresponds to the respective frequency band and relates decibel levels to bin-specific attenuation values. Furthermore, for each respective frequency bin within the frequency band, the device may be configured to determine an approximate decibel level at the respective frequency bin based on the plurality of audio signals, determine a bin-specific attenuation multiplier corresponding to the respective frequency bin based on the average decibel level at the respective frequency bin and the respective band-specific lookup table, and input the bin-specific attenuation multiplier to the attenuation vector. The device may be configured to scale each bin-specific attenuation value in the attenuation vector with the overall attenuation multiplier, and editing each of the audio signals based on the scaled bin-specific attenuation values in attenuation vector.

According to other implementations of the present disclosure, a device for processing a plurality of audio signals is disclosed. The device may be configured to receive the plurality of audio signals in a frequency domain. Each audio signal is captured by a respective audio recording device and transformed from a time domain to the frequency domain. The frequency domain is divided into a plurality of frequency bins that collectively span the frequency domain, and each audio signal is represented by a plurality of magnitudes respectively corresponding to the plurality of frequency bins of the frequency domain. Each magnitude represents a magnitude of the audio signal at the corresponding frequency bin. The device may be configured to determine an attenuation vector comprising a plurality of bin-specific attenuation multipliers, each bin-specific attenuation multiplier respectively corresponding to a different frequency bin of the plurality of frequency bins. Determining the attenuation vector includes separating the plurality of audio signals into a plurality of frequency bands, wherein the plurality of frequency bands collectively span the frequency domain, and each respective band is spanned by two or more frequency bins of the plurality of the frequency bins, and for each respective frequency band obtaining a band-specific lookup table from a plurality of band-specific lookup tables. The band-specific lookup table corresponds to the respective frequency band and relates decibel levels to bin-specific attenuation values. Furthermore, for each respective frequency bin within the frequency band, the determining the attenuation vector includes determining an approximate decibel level at the respective frequency bin based on the plurality of audio signals, determining a bin-specific attenuation multiplier corresponding to the respective frequency bin based on the average decibel level at the respective frequency bin and the respective band-specific lookup table, and inputting the bin-specific attenuation multiplier to the attenuation vector. The device may be configured to edit each of the audio signals based on the bin-specific values in the attenuation vector.

These and other objects, features, and characteristics of the apparatus, system, and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the disclosure. As used in the specification and in the claims, the singular forms of "a," "an," and "the" include plural referents unless the context clearly dictates otherwise.

BRIEF DESCRIPTION OF THE DRAWINGS

The disclosed embodiments have other advantages and features which will be more readily apparent from the detailed description, the appended claims, and the accompanying figures. A brief introduction of the figures is below.

FIGS. 4A-4D are schematics illustrating examples of different band-specific lookup tables.

Figure 1:
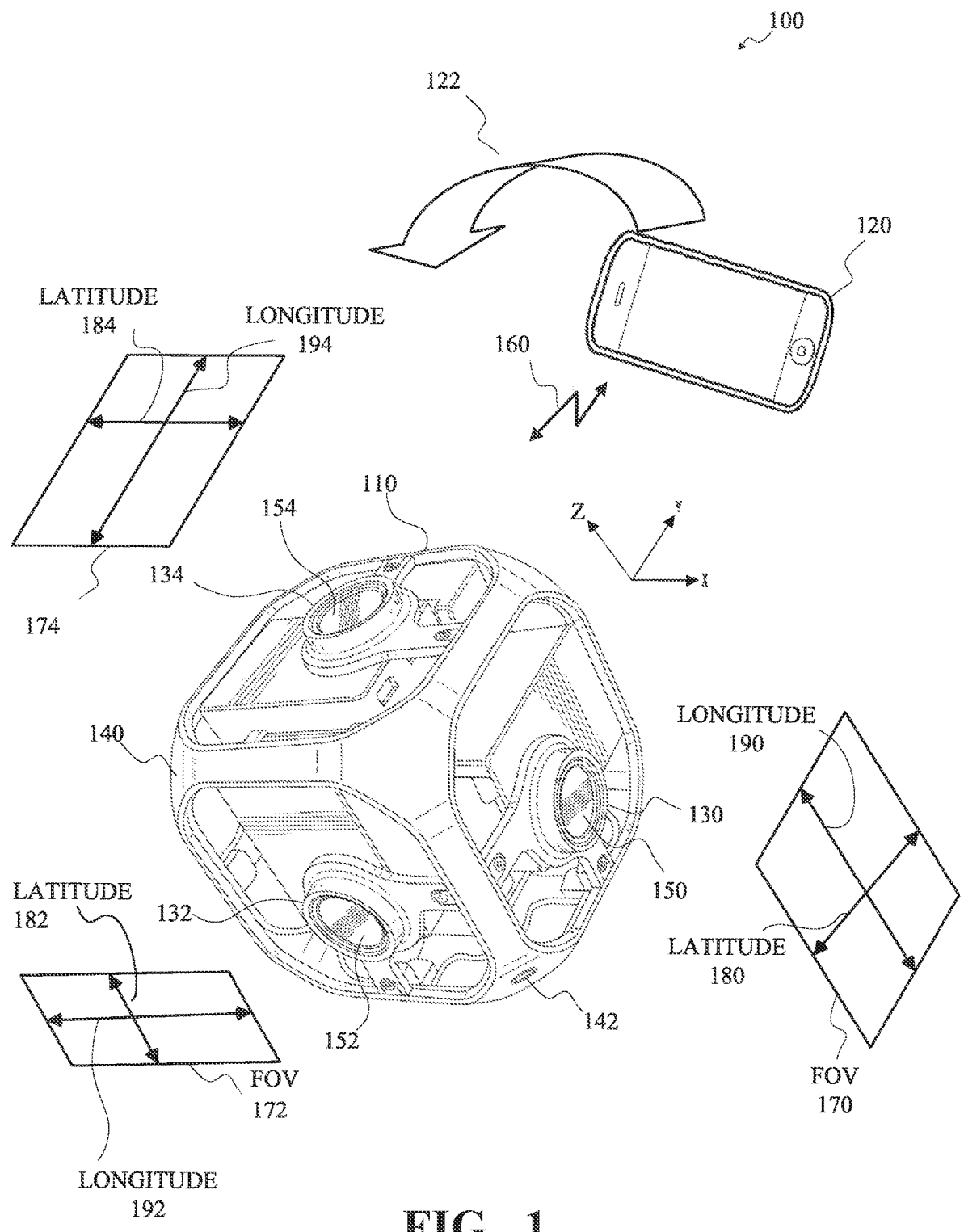
FIG. 1 is a schematic illustrating an example of an image capture system according to some implementations of the present disclosure.

All figures disclosed herein are © Copyright 2020 GoPro Inc. All rights reserved.

DETAILED DESCRIPTION

Implementations of the present technology will now be described in detail with reference to the drawings, which are provided as examples so as to enable those skilled in the art to practice the technology. The figures and examples are not meant to limit the scope of the present disclosure to a single implementation or embodiment, and other implementations and embodiments are possible by way of interchange of, or combination with, some or all of the described or illustrated elements. Wherever convenient, the same reference numbers will be used throughout the drawings to refer to same or like parts.

The present disclosure is directed to a multiband noise gate that is configured to remove or reduce the noise floor observed in one or more audio signals. The noise floor is the portion of an audio signal that is created from the collection of noise sources and unwanted signals within an audio capturing system. Because the noise floor may be observed across many frequencies in the audio signals, and is not specific to just high or low frequencies, removing or reducing the noise floor from captured audio signals is a difficult task. Furthermore, in some scenarios it is desirable to preserve low level noises that are captured at or around the same level as the noise floor. In these situations, it is further desired to remove or reduce the noise floor, so as not to overshadow or drown out the desired audio. According to some implementations of the present disclosure, the multiband noise gate is embedded in an image capture device. An image capture device may refer to a video camera, a drone, a mobile handheld device, or any other suitable device.

A multiband noise gate receives one or more audio signals, where each audio signal is captured by a respective audio capture device (e.g., a microphone) and has been transformed into the frequency domain from the time domain. In the frequency domain, an audio signal is represented by a set of frequency bins (or "bins"), where each frequency bin represents a different range of frequencies. For example, a first bin may represent 1 Hz to 100 Hz, a second bin may represent 101 Hz to 200 Hz, and so on and so forth. Collectively, the frequency bins span the entire frequency domain. Furthermore, in the frequency domain each bin may have a value associated therewith. The value at a bin may be a complex magnitude and may be representative of the decibel level of the audio signal at the frequency range of the particular bin.

In some implementations, the multiband noise gate includes an overall gate and a bin-by-bin gate. The bin-by-bin gate separates the audio signal into a series of frequency bands. Each frequency band may have one or more frequency bins included therein. Each frequency band further has a band-specific lookup mechanism (e.g., a lookup table) configured therefor. The band-specific lookup tables relate decibel values to attenuation multipliers, such that the bin-by-bin gate looks up one or more attenuation multipliers for each frequency bin in the frequency band using a decibel value at the frequency bin. In operation, the bin-by-bin gate determines an average decibel level at each frequency bin based on the one or more audio signals. For instance, if a first complex magnitude at a first bin of a first audio signal has a value of six, a second complex magnitude at a first bin of a second audio signal is seven, and a third complex magnitude at a first bin of a third audio signal is seven, the bin-by-bin gate may determine an average decibel value based on the first complex magnitude, the second complex magnitude, and the third complex magnitude. In some implementations, the bin-by-bin gate calculates a logarithm of the root mean square of the complex magnitudes of the frequency bin to obtain the approximate average decibel level. The bin-by-bin gate can then look up a bin-specific attenuation multiplier for a particular bin from the band-specific lookup mechanism using on the average decibel level. The bin-specific attenuation multiplier is an attenuation multiplier between zero and one that is used to attenuate the portion of the audio signal (e.g., an audio frame thereof) at the frequency range of the frequency bin. The bin-by-bin gate can add (e.g., concatenate) each bin-specific attenuation multiplier to an attenuation vector. The attenuation vector is a data structure that is used to scale the audio signal. Each entry of the attenuation vector corresponds to a different frequency bin of the frequency domain. For instance, a first entry in the attenuation vector may be a bin-specific attenuation multiplier for scaling the first frequency bin of an audio signal (e.g., between 1 and 100 Hz), a second entry in the attenuation vector may be a bin-specific attenuation multiplier for scaling the second frequency bin of an audio signal (e.g., between 101 Hz and 200 Hz), and so on and so forth.

The overall gate operates on the audio signal in the full range of frequencies. The overall gate outputs an overall attenuation multiplier. The overall attenuation multiplier is a value between zero and one that is used to scale the attenuation vector. In some implementations, the overall gate receives the set of audio signals and determines an average decibel level across the entire frequency domain. In some implementations, the overall gate determines twenty times the logarithm of a root mean square of the complex magnitudes of all the frequency bins spanning the entire frequency domain for all of the audio signals. This value may be the average decibel level of the audio signal for a particular audio frame. In some implementations, the average decibel level value may be smoothed using, for example, a Butterworth filter based on the average decibel levels of one or more previous audio frames. The overall gate may then determine the overall attenuation multiplier based on the average decibel level using an overall lookup mechanism. The overall lookup mechanism may include a lookup table that relates decibel level values to attenuation multipliers. As opposed to the band-specific lookup mechanisms, the overall lookup mechanism may be configured across all the frequency bins of the frequency domain.

The multiband noise gate may then multiply the attenuation vector by the overall attenuation multiplier to obtain a scaled attenuation vector. The multiband noise gate (or another component) may then process the audio signal using the attenuation vector. For instance, the multiband noise gate may multiply each of the audio signals by the attenuation vector. The processed audio signal may then be inverse transformed back into the time domain. The resultant audio signal in the time domain may then be stored and/or output to an audio output device (e.g., a speaker).

FIG. 1 is a diagram of an example of an image capture system 100 for content capture in accordance with implementations of this disclosure. As shown in FIG. 1, an image capture system 100 may include an image capture device 110, an external user interface (UI) device 120, or a combination thereof.

In some implementations, the image capture device 110 may be a multi-face apparatus and may include multiple image capture devices, such as image capture devices 130, 132, 134 as shown in FIG. 1, arranged in a structure 140, such as a cube-shaped cage as shown. Although three image capture devices 130, 132, 134 are shown for simplicity in FIG. 1, the image capture device 110 may include any number of image capture devices. For example, the image capture device 110 shown in FIG. 1 may include six cameras, which may include the three image capture devices 130, 132, 134 shown and three cameras not shown.

In some implementations, the structure 140 may have dimensions, such as between 25 mm and 150 mm. For example, the length of each side of the structure 140 may be 105 mm. The structure 140 may include a mounting port 142, which may be removably attachable to a supporting structure, such as a tripod, a photo stick, or any other camera mount (not shown). The structure 140 may be a rigid support structure, such that the relative orientation of the image capture devices 130, 132, 134 of the image capture device 110 may be maintained in relatively static or fixed alignment, except as described herein.

The image capture device 110 may obtain, or capture, image content, such as images, video, or both, with a 360° field-of-view, which may be referred to herein as panoramic or spherical content. For example, each of the image capture devices 130, 132, 134 may include respective lenses, for receiving and focusing light, and respective image sensors for converting the received and focused light to an image signal, such as by measuring or sampling the light, and the multiple image capture devices 130, 132, 134 may be arranged such that respective image sensors and lenses capture a combined field-of-view characterized by a spherical or near spherical field-of-view.

In some implementations, each of the image capture devices 130, 132, 134 may have a respective field-of-view 170, 172, 174, such as a field-of-view 170, 172, 174 that 90° in a lateral dimension 180, 182, 184 and includes 120° in a longitudinal dimension 190, 192, 194. In some implementations, image capture devices 130, 132, 134 having overlapping fields-of-view 170, 172, 174, or the image sensors thereof, may be oriented at defined angles, such as at 90°, with respect to one another. In some implementations, the image sensor of the image capture device 130 is directed along the X axis, the image sensor of the image capture device 132 is directed along the Y axis, and the image sensor of the image capture device 134 is directed along the Z axis. The respective fields-of-view 170, 172, 174 for adjacent image capture devices 130, 132, 134 may be oriented to allow overlap for a stitching function. For example, the longitudinal dimension 190 of the field-of-view 170 for the image capture device 130 may be oriented at 90° with respect to the latitudinal dimension 184 of the field-of-view 174 for the image capture device 134, the latitudinal dimension 180 of the field-of-view 170 for the image capture device 130 may be oriented at 90° with respect to the longitudinal dimension 192 of the field-of-view 172 for the image capture device 132, and the latitudinal dimension 182 of the field-of-view 172 for the image capture device 132 may be oriented at 90° with respect to the longitudinal dimension 194 of the field-of-view 174 for the image capture device 134.

The image capture device 110 shown in FIG. 1 may have 420° angular coverage in vertical and/or horizontal planes by the successive overlap of 90°, 120°, 90°, 120° respective fields-of-view 170, 172, 174 (not all shown) for four adjacent image capture devices 130, 132, 134 (not all shown). For example, fields-of-view 170, 172 for the image capture devices 130, 132 and fields-of-view (not shown) for two image capture devices (not shown) opposite the image capture devices 130, 132 respectively may be combined to provide 420° angular coverage in a horizontal plane. In some implementations, the overlap between fields-of-view of image capture devices 130, 132, 134 having a combined field-of-view including less than 360° angular coverage in a vertical and/or horizontal plane may be aligned and merged or combined to produce a panoramic image. For example, the image capture device 110 may be in motion, such as rotating, and source images captured by at least one of the image capture devices 130, 132, 134 may be combined to form a panoramic image. As another example, the image capture device 110 may be stationary, and source images captured contemporaneously by each image capture device 130, 132, 134 may be combined to form a panoramic image.

In some implementations, an image capture device 130, 132, 134 may include a lens 150, 152, 154 or other optical element. An optical element may include one or more lens, macro lens, zoom lens, special-purpose lens, telephoto lens, prime lens, achromatic lens, apochromatic lens, process lens, wide-angle lens, ultra-wide-angle lens, fisheye lens, infrared lens, ultraviolet lens, perspective control lens, other lens, and/or other optical element. In some implementations, a lens 150, 152, 154 may be a fisheye lens and produce fisheye, or near-fisheye, field-of-view images. For example, the respective lenses 150, 152, 154 of the image capture devices 130, 132, 134 may be fisheye lenses. In some implementations, images captured by two or more image capture devices 130, 132, 134 of the image capture device 110 may be combined by stitching or merging fisheye projections of the captured images to produce an equirectangular planar image. For example, a first fisheye image may be a round or elliptical image, and may be transformed to a first rectangular image, a second fisheye image may be a round or elliptical image, and may be transformed to a second rectangular image, and the first and second rectangular images may be arranged side-by-side, which may include overlapping, and stitched together to form the equirectangular planar image.

Although not expressly shown in FIG. 1, In some implementations, an image capture device 130, 132, 134 may include one or more image sensors, such as a charge-coupled device (CCD) sensor, an active pixel sensor (APS), a complementary metal-oxide semiconductor (CMOS) sensor, an N-type metal-oxide-semiconductor (NMOS) sensor, and/or any other image sensor or combination of image sensors.

Although not expressly shown in FIG. 1, In some implementations, an image capture device 110 may include one or more microphones, which may receive, capture, and record audio information, which may be associated with images acquired by the image sensors.

Although not expressly shown in FIG. 1, the image capture device 110 may include one or more other information sources or sensors, such as an inertial measurement unit (IMU), a global positioning system (GPS) receiver component, a pressure sensor, a temperature sensor, a heart rate sensor, or any other unit, or combination of units, that may be included in an image capture apparatus.

In some implementations, the image capture device 110 may interface with or communicate with an external device, such as the external user interface (UI) device 120, via a wired (not shown) or wireless (as shown) computing communication link 160. Although a single computing communication link 160 is shown in FIG. 1 for simplicity, any number of computing communication links may be used. Although the computing communication link 160 shown in FIG. 1 is shown as a direct computing communication link, an indirect computing communication link, such as a link including another device or a network, such as the internet, may be used. In some implementations, the computing communication link 160 may be a Wi-Fi link, an infrared link, a Bluetooth (BT) link, a cellular link, a ZigBee link, a near field communications (NFC) link, such as an ISO/IEC 23243 protocol link, an Advanced Network Technology interoperability (ANT+) link, and/or any other wireless communications link or combination of links. In some implementations, the computing communication link 160 may be an HDMI link, a USB link, a digital video interface link, a display port interface link, such as a Video Electronics Standards Association (VESA) digital display interface link, an Ethernet link, a Thunderbolt link, and/or other wired computing communication link.

In some implementations, the user interface device 120 may be a computing device, such as a smartphone, a tablet computer, a phablet, a smart watch, a portable computer, and/or another device or combination of devices configured to receive user input, communicate information with the image capture device 110 via the computing communication link 160, or receive user input and communicate information with the image capture device 110 via the computing communication link 160.

In some implementations, the image capture device 110 may transmit images, such as panoramic images, or portions thereof, to the user interface device 120 via the computing communication link 160, and the user interface device 120 may store, process, display, or a combination thereof the panoramic images.

In some implementations, the user interface device 120 may display, or otherwise present, content, such as images or video, acquired by the image capture device 110. For example, a display of the user interface device 120 may be a viewport into the three-dimensional space represented by the panoramic images or video captured or created by the image capture device 110.

In some implementations, the user interface device 120 may communicate information, such as metadata, to the image capture device 110. For example, the user interface device 120 may send orientation information of the user interface device 120 with respect to a defined coordinate system to the image capture device 110, such that the image capture device 110 may determine an orientation of the user interface device 120 relative to the image capture device 110. Based on the determined orientation, the image capture device 110 may identify a portion of the panoramic images or video captured by the image capture device 110 for the image capture device 110 to send to the user interface device 120 for presentation as the viewport. In some implementations, based on the determined orientation, the image capture device 110 may determine the location of the user interface device 120 and/or the dimensions for viewing of a portion of the panoramic images or video.

In an example, a user may rotate (sweep) the user interface device 120 through an arc or path 122 in space, as indicated by the arrow shown at 122 in FIG. 1. The user interface device 120 may communicate display orientation information to the image capture device 110 using a communication interface such as the computing communication link 160. The image capture device 110 may provide an encoded bit stream to enable viewing of a portion of the panoramic content corresponding to a portion of the environment of the display location as the image capture device 110 traverses the path 122. Accordingly, display orientation information from the user interface device 120 may be transmitted to the image capture device 110 to control user selectable viewing of captured images and/or video.

In some implementations, the image capture device 110 may communicate with one or more other external devices (not shown) via wired or wireless computing communication links (not shown).

In some implementations, data, such as image data, audio data, and/or other data, obtained by the image capture device 110 may be incorporated into a combined multimedia stream. For example, the multimedia stream may include a video track and/or an audio track. As another example, information from various metadata sensors and/or sources within and/or coupled to the image capture device 110 may be processed to produce a metadata track associated with the video and/or audio track. The metadata track may include metadata, such as white balance metadata, image sensor gain metadata, sensor temperature metadata, exposure time metadata, lens aperture metadata, bracketing configuration metadata and/or other parameters. In some implementations, a multiplexed stream may be generated to incorporate a video and/or audio track and one or more metadata tracks.

In some implementations, the user interface device 120 may implement or execute one or more applications to manage or control the image capture device 110. For example, the user interface device 120 may include an application for controlling camera configuration, video acquisition, video display, or any other configurable or controllable aspect of the image capture device 110.

In some implementations, the user interface device 120, such as via an application (e.g., a mobile device App), may generate and share, such as via a cloud-based or social media service, one or more images, or short video clips, such as in response to user input.

In some implementations, the user interface device 120, such as via an application (e.g., a mobile device App), may remotely control the image capture device 110, such as in response to user input.

In some implementations, the user interface device 120, such as via an application (e.g., a mobile device App), may display unprocessed or minimally processed images or video captured by the image capture device 110 contemporaneously with capturing the images or video by the image capture device 110, such as for shot framing, which may be referred to herein as a live preview, and which may be performed in response to user input.

In some implementations, the user interface device 120, such as via an application (e.g., a mobile device App), may mark one or more key moments contemporaneously with capturing the images or video by the image capture device 110, such as with a HiLight Tag, such as in response to user input.

In some implementations, the user interface device 120, such as via an application (e.g., a mobile device App), may display, or otherwise present, marks or tags associated with images or video, such as HiLight Tags, such as in response to user input. For example, marks may be presented in a mobile device application for location review and/or playback of video highlights.

In some implementations, the user interface device 120, such as via an application (e.g., a mobile device App), may wirelessly control camera software, hardware, or both. For example, the user interface device 120 may include a web-based graphical interface accessible by a user for selecting a live or previously recorded video stream from the image capture device 110 for display on the user interface device 120.

In some implementations, the user interface device 120 may receive information indicating a user setting, such as an image resolution setting (e.g., 3840 pixels by 2160 pixels), a frame rate setting (e.g., 60 frames per second (fps)), a location setting, and/or a context setting, which may indicate an activity, such as mountain biking, in response to user input, and may communicate the settings, or related information, to the image capture device 110.

It is noted that the image capture system 100 is provided for example only. The techniques described herein may be applied in any image capture device 110 that is configured to record audio signals.

Figure 2:
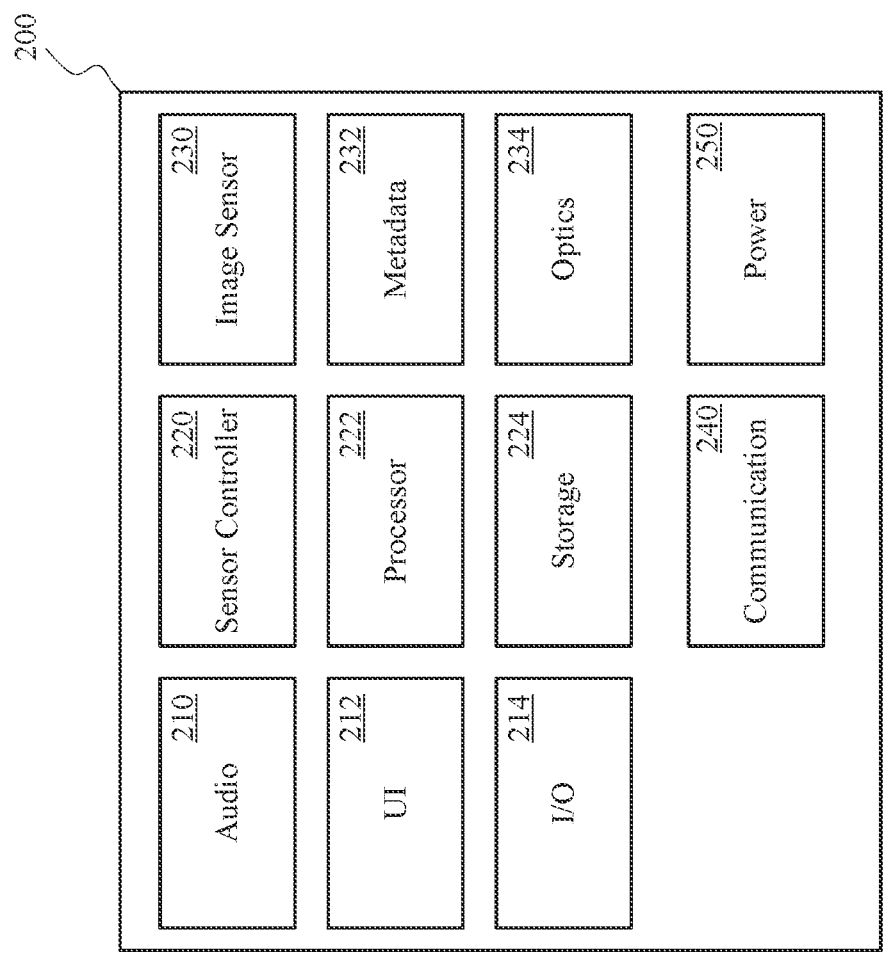
FIG. 2 is a schematic illustrating an example set of components of an image capture device according to some implementations of the present disclosure.

FIG. 2 is a block diagram of an example of an image capture device 200 in accordance with implementations of this disclosure. In some implementations, an image capture device 200, such as one of the image capture devices 130, 132, 134 shown in FIG. 1, which may be an action camera, may include an audio component 210, a user interface (UI) unit 212, an input/output (I/O) unit 214, a sensor controller 220, a processor 222, an electronic storage unit 224, an image sensor 230, a metadata unit 232, an optics unit 234, a communication unit 240, a power system 250, or a combination thereof.

In some implementations, the audio component 210, which may include one or more microphones, may receive, sample, capture, record, or a combination thereof audio information, such as sound waves, which may be associated with, such as stored in association with, image or video content contemporaneously captured by the image capture device 200. In some implementations, audio information may be encoded using, e.g., Advanced Audio Coding (AAC), Audio Compression-3 (AC3), Moving Picture Experts Group Layer-3 Audio (MP3), linear Pulse Code Modulation (PCM), Motion Picture Experts Group—High efficiency coding and media delivery in heterogeneous environments (MPEG-H), and/or other audio coding formats (audio codecs). In one or more implementations of spherical video and/or audio, the audio codec may include a three-dimensional audio codec, such as Ambisonics. For example, an Ambisonics codec can produce full surround audio including a height dimension. Using a G-format Ambisonics codec, a special decoder may be omitted.

In some implementations, the user interface unit 212 may include one or more units that may register or receive input from and/or present outputs to a user, such as a display, a touch interface, a proximity sensitive interface, a light receiving/emitting unit, a sound receiving/emitting unit, a wired/wireless unit, and/or other units. In some implementations, the user interface unit 212 may include a display, one or more tactile elements (e.g., buttons and/or virtual touch screen buttons), lights (LEDs), speakers, and/or other user interface elements. The user interface unit 212 may receive user input and/or provide information to a user related to the operation of the image capture device 200.

In some implementations, the user interface unit 212 may include a display unit that presents information related to camera control or use, such as operation mode information (e.g., image resolution, frame rate, capture mode, sensor mode, video mode, photo mode), connection status information (e.g., connected, wireless, wired connection), power mode information (e.g., standby mode, sensor mode, video mode), information related to other information sources (e.g., heart rate, GPS), and/or other information.

In some implementations, the user interface unit 212 may include a user interface component such as one or more buttons, which may be operated, such as by a user, to control camera operations, such as to start, stop, pause, and/or resume sensor and/or content capture. The camera control associated with respective user interface operations may be defined. For example, the camera control associated with respective user interface operations may be defined based on the duration of a button press (pulse width modulation), a number of button presses (pulse code modulation), or a combination thereof. In an example, a sensor acquisition mode may be initiated in response to detecting two short button presses. In another example, the initiation of a video mode and cessation of a photo mode, or the initiation of a photo mode and cessation of a video mode, may be triggered (toggled) in response to a single short button press. In another example, video or photo capture for a given time duration or a number of frames (burst capture) may be triggered in response to a single short button press. Other user command or communication implementations may also be implemented, such as one or more short or long button presses.

In some implementations, the I/O unit 214 may synchronize the image capture device 200 with other cameras and/or with other external devices, such as a remote control, a second image capture device, a smartphone, a user interface device, such as the user interface device 120 shown in FIG. 1, and/or a video server. The I/O unit 214 may communicate information between I/O components. In some implementations, the I/O unit 214 may be connected to the communication unit 240 to provide a wired and/or wireless communications interface (e.g., Wi-Fi, Bluetooth, USB, HDMI, Wireless USB, Near Field Communication (NFC), Ethernet, a radio frequency transceiver, and/or other interfaces) for communication with one or more external devices, such as a user interface device, such as the user interface device 120 shown in FIG. 1, or another metadata source. In some implementations, the I/O unit 214 may interface with LED lights, a display, a button, a microphone, speakers, and/or other I/O components. In some implementations, the I/O unit 214 may interface with an energy source, e.g., a battery, and/or a Direct Current (DC) electrical source.

In some implementations, the I/O unit 214 of the image capture device 200 may include one or more connections to external computerized devices for configuration and/or management of remote devices, as described herein. The I/O unit 214 may include any of the wireless or wireline interfaces described herein, and/or may include customized or proprietary connections for specific applications.

In some implementations, the sensor controller 220 may operate or control the image sensor 230, such as in response to input, such as user input. In some implementations, the sensor controller 220 may receive image and/or video input from the image sensor 230 and may receive audio information from the audio component 210.

In some implementations, the processor 222 may include a system on a chip (SOC), microcontroller, microprocessor, CPU, DSP, application-specific integrated circuit (ASIC), GPU, and/or other processor that may control the operation and functionality of the image capture device 200. In some implementations, the processor 222 may interface with the sensor controller 220 to obtain and process sensory information for, e.g., object detection, face tracking, stereo vision, and/or other image processing.

In some implementations, the sensor controller 220, the processor 222, or both may synchronize information received by the image capture device 200. For example, timing information may be associated with received sensor data, and metadata information may be related to content (photo/video) captured by the image sensor 230 based on the timing information. In some implementations, the metadata capture may be decoupled from video/image capture. For example, metadata may be stored before, after, and in-between the capture, processing, or storage of one or more video clips and/or images.

In some implementations, the sensor controller 220, the processor 222, or both may evaluate or process received metadata and may generate other metadata information. For example, the sensor controller 220 may integrate the received acceleration information to determine a velocity profile for the image capture device 200 concurrent with recording a video. In some implementations, video information may include multiple frames of pixels and may be encoded using an encoding method (e.g., H.265, H.264, CineForm, and/or other codec).

Although not shown separately in FIG. 2, one or more of the audio component 210, the user interface unit 212, the I/O unit 214, the sensor controller 220, the processor 222, the electronic storage unit 224, the image sensor 230, the metadata unit 232, the optics unit 234, the communication unit 240, or the power systems 250 of the image capture device 200 may communicate information, power, or both with one or more other units, such as via an electronic communication pathway, such as a system bus. For example, the processor 222 may interface with the audio component 210, the user interface unit 212, the I/O unit 214, the sensor controller 220, the electronic storage unit 224, the image sensor 230, the metadata unit 232, the optics unit 234, the communication unit 240, or the power systems 250 via one or more driver interfaces and/or software abstraction layers.

In some implementations, one or more of the units shown in FIG. 2 may include a dedicated processing unit, memory unit, or both (not shown). In some implementations, one or more components may be operable by one or more other control processes. For example, a GPS receiver may include a processing apparatus that may provide position and/or motion information to the processor 222 in accordance with a defined schedule (e.g., values of latitude, longitude, and elevation at 10 Hz).

In some implementations, the electronic storage unit 224 may include a system memory module that may store executable computer instructions that, when executed by the processor 222, perform various functionalities including those described herein. For example, the electronic storage unit 224 may be a non-transitory computer-readable storage medium, which may include executable instructions, and a processor, such as the processor 222 may execute the instruction to perform one or more, or portions of one or more, of the operations described herein. The electronic storage unit 224 may include storage memory for storing content (e.g., metadata, images, audio) captured by the image capture device 200.

In some implementations, the electronic storage unit 224 may include non-transitory memory for storing configuration information and/or processing code for video information and metadata capture, and/or to produce a multimedia stream that may include video information and metadata in accordance with the present disclosure. In some implementations, the configuration information may include capture type (video, still images), image resolution, frame rate, burst setting, white balance, recording configuration (e.g., loop mode), audio track configuration, and/or other parameters that may be associated with audio, video, and/or metadata capture. In some implementations, the electronic storage unit 224 may include memory that may be used by other hardware/firmware/software elements of the image capture device 200.

In some implementations, the image sensor 230 may include one or more of a charge-coupled device sensor, an active pixel sensor, a complementary metal-oxide semiconductor sensor, an N-type metal-oxide-semiconductor sensor, and/or another image sensor or combination of image sensors. In some implementations, the image sensor 230 may be controlled based on control signals from a sensor controller 220.

The image sensor 230 may sense or sample light waves gathered by the optics unit 234 and may produce image data or signals. The image sensor 230 may generate an output signal conveying visual information regarding the objects or other content corresponding to the light waves received by the optics unit 234. The visual information may include one or more of an image, a video, and/or other visual information.

In some implementations, the image sensor 230 may include a video sensor, an acoustic sensor, a capacitive sensor, a radio sensor, a vibrational sensor, an ultrasonic sensor, an infrared sensor, a radar sensor, a Light Detection And Ranging (LIDAR) sensor, a sonar sensor, or any other sensory unit or combination of sensory units capable of detecting or determining information in a computing environment.

In some implementations, the metadata unit 232 may include sensors such as an IMU, which may include one or more accelerometers and/or gyroscopes, a magnetometer, a compass, a GPS sensor, an altimeter, an ambient light sensor, a temperature sensor, and/or other sensors or combinations of sensors. In some implementations, the image capture device 200 may contain one or more other metadata/ telemetry sources, e.g., image sensor parameters, battery monitor, storage parameters, and/or other information related to camera operation and/or capture of content. The metadata unit 232 may obtain information related to the environment of the image capture device 200 and aspects in which the content is captured.

For example, the metadata unit 232 may include an accelerometer that may provide device motion information including velocity and/or acceleration vectors representative of motion of the image capture device 200. In another example, the metadata unit 232 may include a gyroscope that may provide orientation information describing the orientation of the image capture device 200. In another example, the metadata unit 232 may include a GPS sensor that may provide GPS coordinates, time, and information identifying a location of the image capture device 200. In another example, the metadata unit 232 may include an altimeter that may obtain information indicating an altitude of the image capture device 200.

In some implementations, the metadata unit 232, or one or more portions thereof, may be rigidly coupled to the image capture device 200 such that motion, changes in orientation, or changes in the location of the image capture device 200 may be accurately detected by the metadata unit 232. Although shown as a single unit, the metadata unit 232, or one or more portions thereof, may be implemented as multiple distinct units. For example, the metadata unit 232 may include a temperature sensor as a first physical unit and a GPS unit as a second physical unit. In some implementations, the metadata unit 232, or one or more portions thereof, may be included in an image capture device 200 as shown, or may be included in a physically separate unit operatively coupled to, such as in communication with, the image capture device 200.

In some implementations, the optics unit 234 may include one or more of a lens, macro lens, zoom lens, special-purpose lens, telephoto lens, prime lens, achromatic lens, apochromatic lens, process lens, wide-angle lens, ultra-wide-angle lens, fisheye lens, infrared lens, ultraviolet lens, perspective control lens, other lens, and/or other optics component. In some implementations, the optics unit 234 may include a focus controller unit that may control the operation and configuration of the camera lens. The optics unit 234 may receive light from an object and may focus received light onto an image sensor 230. Although not shown separately in FIG. 2, in some implementations, the optics unit 234 and the image sensor 230 may be combined, such as in a combined physical unit, such as a housing.

In some implementations, the communication unit 240 may be coupled to the I/O unit 214 and may include a component (e.g., a dongle) having an infrared sensor, a radio frequency transceiver and antenna, an ultrasonic transducer, and/or other communications interfaces used to send and receive wireless communication signals. In some implementations, the communication unit 240 may include a local (e.g., Bluetooth, Wi-Fi) and/or broad range (e.g., cellular LTE) communications interface for communication between the image capture device 200 and a remote device (e.g., the user interface device 120 in FIG. 1). The communication unit 240 may communicate using, for example, Ethernet, 802.11, worldwide interoperability for microwave access (WiMAX), 3G, Long Term Evolution (LTE), digital subscriber line (DSL), asynchronous transfer mode (ATM), InfiniBand, PCI Express Advanced Switching, and/or other communication technologies. In some implementations, the communication unit 240 may communicate using networking protocols, such as multiprotocol label switching (MPLS), transmission control protocol/Internet protocol (TCP/IP), User Datagram Protocol (UDP), hypertext transport protocol (HTTP), simple mail transfer protocol (SMTP), file transfer protocol (FTP), and/or other networking protocols.

Information exchanged via the communication unit 240 may be represented using formats including one or more of hypertext markup language (HTML), extensible markup language (XML), and/or other formats. One or more exchanges of information between the image capture device 200 and remote or external devices may be encrypted using encryption technologies including one or more of secure sockets layer (SSL), transport layer security (TLS), virtual private networks (VPNs), Internet Protocol security (IPsec), and/or other encryption technologies.

In some implementations, the one or more power systems 250 supply power to the image capture device 200. For example, for a small-sized, lower-power action camera a wireless power solution (e.g., battery, solar cell, inductive (contactless) power source, rectification, and/or other power supply) may be used.

Consistent with the present disclosure, the components of the image capture device 200 may be remote from one another and/or aggregated. For example, one or more sensor components may be distal from the image capture device 200, e.g., such as shown and described with respect to FIG. 1. Multiple mechanical, sensory, or electrical units may be controlled by a learning apparatus via network/radio connectivity.

Figure 3A:
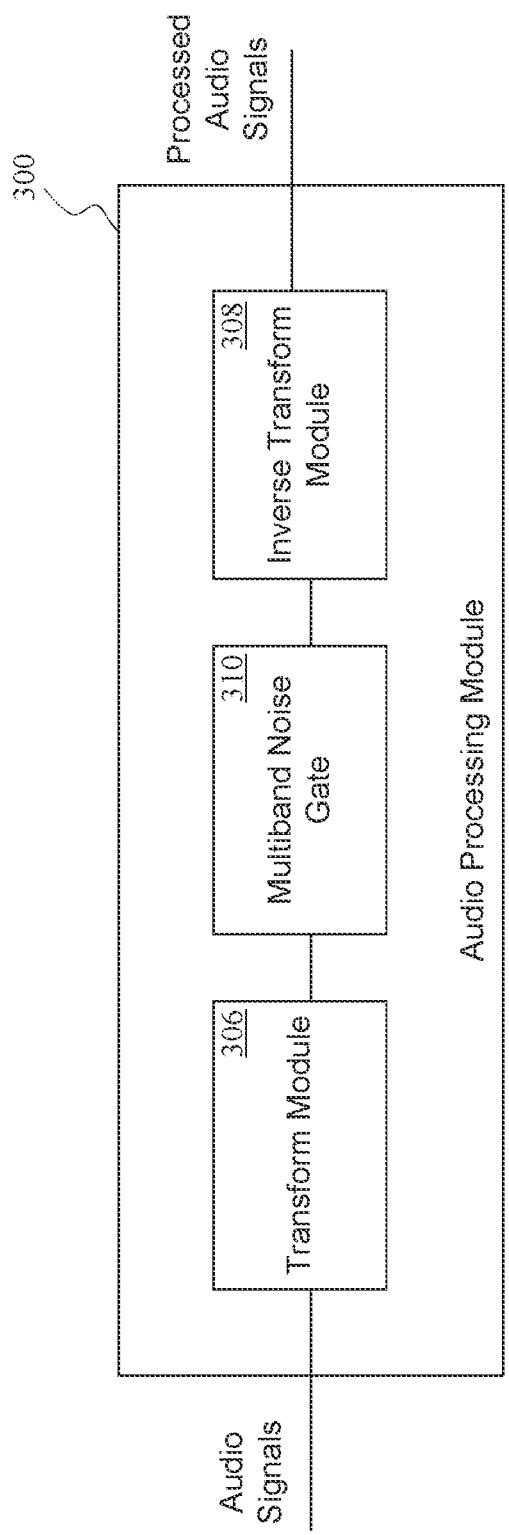
FIG. 3A is a schematic illustrating an example audio processing module according to some implementations of the present disclosure.

FIG. 3A illustrates an example of an audio processing module 300. The audio processing module 300 receives one or more captured audio signals and outputs one or more respective processed audio signals. The captured audio signals and the processed audio signals may be captured in the time domain. The audio processing module 300 may transform the captured audio signals into the frequency domain. For example, the audio processing module 300 may include a transform module 306 that transforms the captured audio signals into the frequency domain. Once in the frequency domain, the audio processing module 300 may filter, scale, edit, or otherwise process the audio signal. Thus, the audio processing module 300 may include a multiband noise gate 310 that receives the audio signals in the frequency domain and scales the audio signals to reduce or remove the noise floor that may have been captured in the one or more captured audio signals. In some implementations, the multiband noise gate 310 may output the audio signals to the inverse transform module 308, which transforms the audio signal back into the time domain. The resultant audio signal may then be stored and/or output to an audio output device. The audio processing module 300 may further implement additional gates, filters, and the like. In some implementations, the processor 222 executes the audio processing module 300. In some implementations, the audio processing module 300 may be implemented as one or more dedicated hardware devices.

Figure 3B:
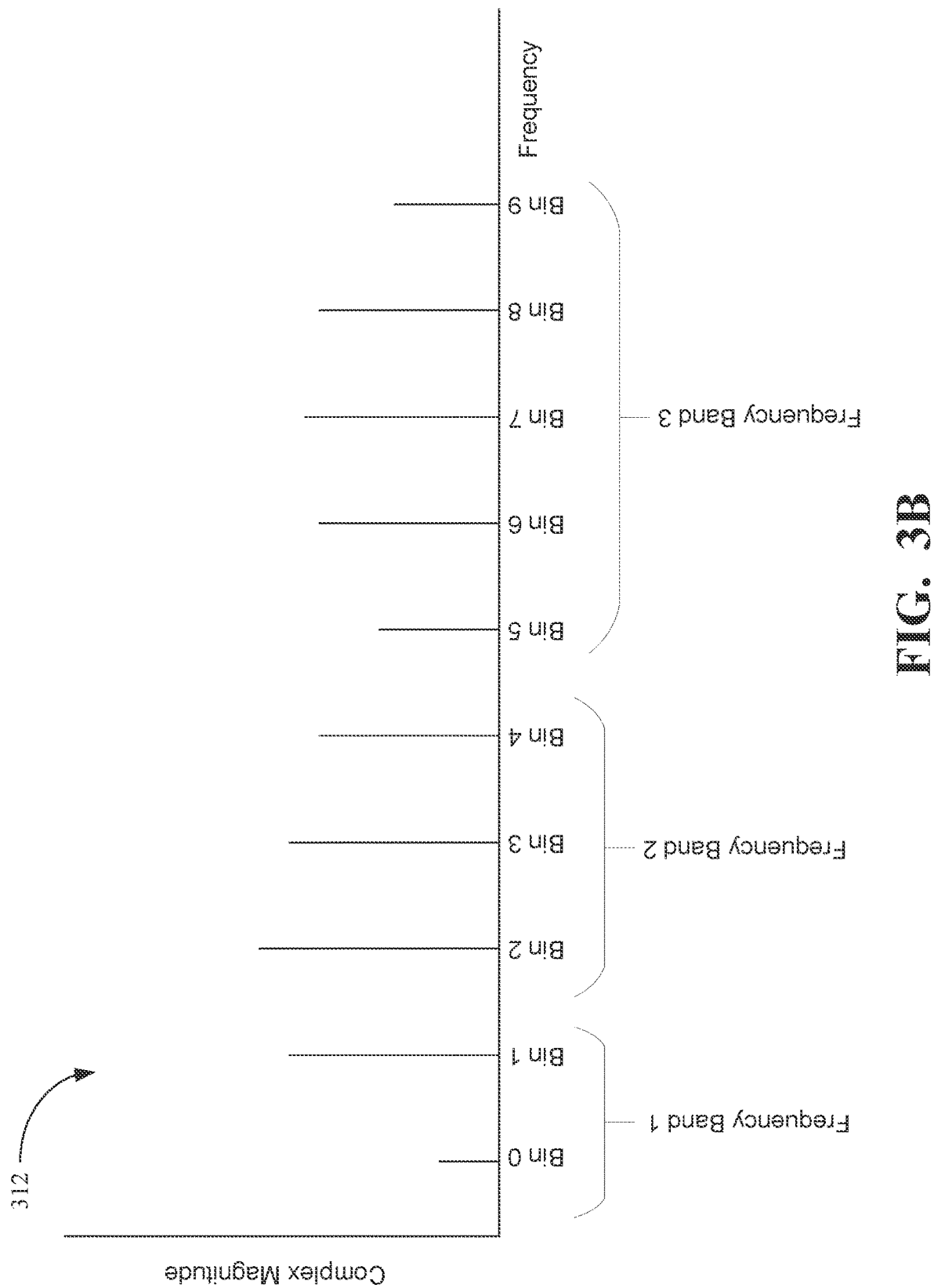
FIG. 3B is a schematic illustrating an example audio signal in the frequency domain.

The transform module 306 receives captured audio signals in the time domain and outputs transformed audio signals in the frequency domain. The transform module 306 may implement any suitable transformation technique. In some implementations, the transform module 306 may implement Fast Fourier transform (FFT). The transform module 306 may, however, incorporate any suitable transform technique, such as Laplace transform. The transform module 306 outputs the audio signal in the frequency domain. The transform module 306 may receive a captured audio signal, which in the time domain may be a series of successive audio frames. Each audio frame may represent a short period or a snapshot of the audio signal. For each audio frame, the transform module 306 may transform the audio frame into its frequency domain representation. In the frequency domain, the audio frame may show how much of the audio signal resides within each frequency bin. FIG. 3B illustrates an example of an audio frame 312 in the frequency domain. In the illustrated example, ten (10) bins span the frequency domain. Each frequency bin may represent a different range of frequencies. The magnitude of each frequency bin indicates the amount of energy in the audio signal at the frequencies contained within the frequency bin. Thus, when a frequency bin (e.g., frequency bin 2) has a greater magnitude than another frequency bin (e.g., frequency bin 5), then the portion of the audio signal at the frequency bin having the greater magnitude is louder than the portion of the audio signal at the frequency bin having a lesser magnitude.

The inverse transform module 308 receives audio signals in the frequency domain and outputs audio signals in the time domain. In some implementations, the inverse transform module 308 receives processed audio frames in the frequency domain and inverse transforms the audio frames into the time domain. The inverse transformed audio frames can be stitched together to generate a processed audio signal. In some implementations, the inverse transform module 308 may implement inverse Fast Fourier transform (IFFT). The inverse transform module 308 may implement any other suitable inverse transform technique, such as inverse Laplace transform.

The multiband noise gate 310 receives one or more audio signals in the frequency domain and scales the audio signal(s) using an attenuation vector. It should be understood that scaling an audio signal using an attenuation vector may refer to scaling of an audio frame within the audio signal. Similarly, all operations that are performed with respect to the audio signal may refer to the operation being performed on an audio frame within audio signal.

In operation, the multiband noise gate 310 separates the audio signal into different frequency bands. FIG. 3B illustrates an example of an audio signal that is separated into three frequency bands. The first frequency band contains frequency bin (0) and frequency bin (1). The second frequency band contains frequency bin (2) through frequency bin (4). The third frequency band contains frequency bin (5) through frequency bin (9). While FIG. 3B illustrates a frequency domain divided into ten frequency bins and three frequency bands, the multiband noise gate 310 may implement any number of frequency bands and any number of frequency bins. For instance, in some example implementations, the multiband gate may be divided into 129 bins that span across four frequency bands. In an example implementation, the first two frequency bins (e.g., bins (0) and (1)) may be contained in the first frequency band, the next ten frequency bins (e.g., bins (2) through (11)) may be contained in the second frequency band, the following 39 bins (e.g., bins (12) through (50)) may be contained in the third frequency band, and the last 78 bins (e.g., bins (51) through (128)) may be contained in the fourth frequency band.

Figure 3C:
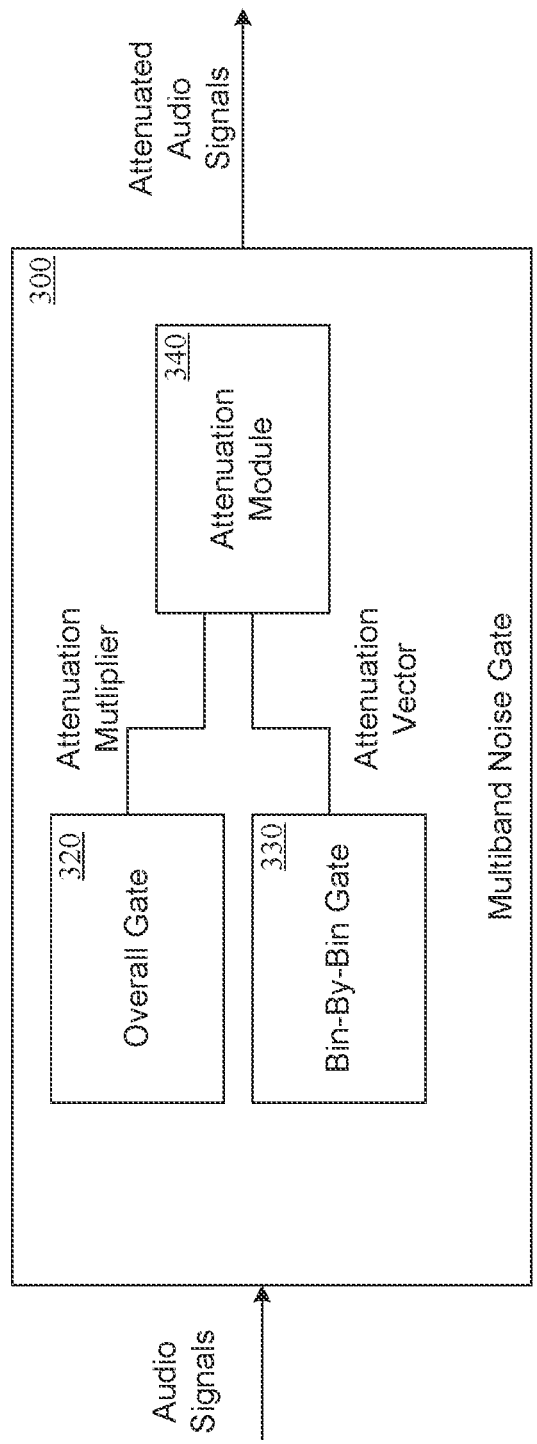
FIGS. 3C and 3D are schematics illustrating an example multiband noise gate according to some implementations of the present disclosure.

FIG. 3C illustrates a multiband noise gate 310 according to some implementations of the present disclosure. In these implementations, the multiband noise gate 310 includes an overall gate 320, a bin-by-bin gate 330, and an attenuation module 340.

The overall gate 320 receives the one or more audio signals in the frequency domain and determines an attenuation multiplier based on the totality of the audio signals. The bin-by-bin gate 330 receives the one or more audio signals and separates the audio signals into respective frequency bands. Then for each band, the bin-by-bin gate 330 determines bin-specific attenuation multipliers for each frequency bin within the frequency band based on a band-specific lookup mechanism. The bin-specific attenuation multiplier is used to attenuate the audio sample at the bin corresponding to the bin-specific attenuation multiplier. A band-specific lookup mechanism is used to determine the bin-specific attenuation multipliers for the bins contained in a respective frequency band. Each frequency band may have a different band-specific lookup mechanism that is used to determine the bin-specific attenuation multipliers for the frequency bins contained in the respective frequency band. The band-specific lookup mechanisms may be empirically determined and optimized for a make and model of an image capturing device. As the bin-by-bin gate 330 determines bin-specific attenuation multipliers, the bin-by-bin gate 330 can add each bin-specific attenuation multiplier to an attenuation vector. Each entry in the attenuation vector may be a bin-specific attenuation multiplier for a respective frequency bin. For instance, the first entry in the attenuation vector may be the bin-specific attenuation multiplier for frequency bin (0), the second entry in the attenuation vector may be the bin-specific attenuation multiplier for frequency bin (1), the third entry in the attenuation vector may be the bin-specific attenuation multiplier for the frequency bin (2), and so on and so forth. Each bin-specific attenuation multiplier may be a value between zero and one.

The attenuation module 340 receives the overall attenuation multiplier and the attenuation vector and attenuates (or scales) the one or more audio signals based thereon. The attenuation module 340 may scale the attenuation vector using the overall attenuation multiplier. For instance, the attenuation module 340 may multiply the attenuation vector by the overall attenuation multiplier. Furthermore, the attenuation module 340 may adjust the scaled attenuation module 340 based on the attenuation vectors determined for prior audio frames in the audio signal. The attenuation module 340 may then attenuate the audio signal based on the attenuation vector. In particular, the attenuation module 340 may multiply the magnitude of each frequency bin with the corresponding bin-specific attenuation multiplier. For instance, the magnitude of the first frequency bin in an audio frame may be multiplied by the first bin-specific attenuation multiplier in the attenuation vector. Similarly, the second frequency bin may be multiplied by the second bin-specific attenuation multiplier in the attenuation vector. As each bin-specific attenuation multiplier and the overall attenuation multiplier are all values between zero and one, the bin-specific attenuation multipliers that are closer to or equal to one maintain the audio levels of the portions of the audio signal that are multiplied by these bin-specific attenuation multipliers; while the bin-specific attenuation multipliers that are closer to or equal to zero greatly reduce or wholly remove the portions of the audio signal that are contained in the frequency bins multiplied by those bin-specific attenuation multipliers. The attenuation module 340 may output the attenuated audio signal, which may be a series of attenuated audio frames in the frequency domain, to the inverse transform module 308.

Figure 3D:
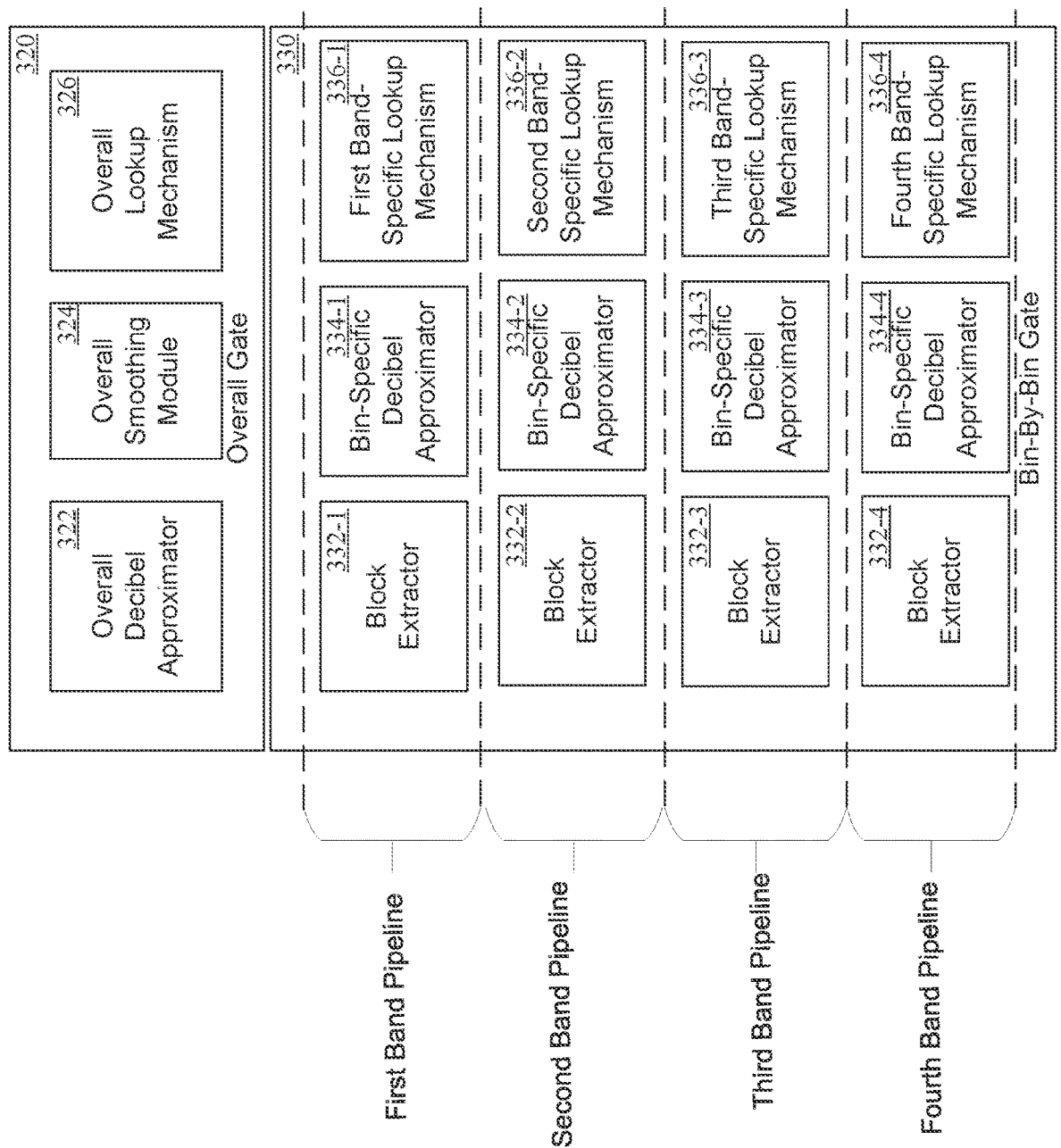

FIG. 3D illustrates example implementations of the overall gate 320 and the bin-by-bin gate 330. In the example of FIG. 3D, the overall gate includes an overall decibel approximator, an overall smoothing module 324, and an overall lookup mechanism 326.

With respect to the overall gate 320, the overall decibel approximator 322 receives the one or more audio signals and determines an approximate decibel level of the one or more audio signals. At each iteration, the overall decibel approximator 322 receives one or more audio frames, where each audio frame represents a snapshot of a respective audio signal in the frequency domain. Thus, if the image capture device 110 includes three microphones and, thus, produces three audio signals, the overall decibel approximator 322 receives three audio frames in the frequency domain. The overall decibel approximator 322 may determine an approximate decibel level across the one or more audio frames by calculating a root mean square (RMS) of all the magnitudes across the set of audio frames. For example, if the frequency domain includes 129 frequency bins, and there are three audio frames, the overall decibel approximator 322 may calculate the root mean square of the 387 magnitude values defined across the three audio frames. In some implementations, the overall decibel approximator 322 may calculate twenty times the logarithm (base ten) of the root mean square to determine the approximate decibel level.

In some implementations, the overall gate 320 may include an overall smoothing module 324. The overall smoothing module 324 receives the approximate decibel level and smooths the value based on one or more previously determined approximate decibel levels. The overall smoothing module 324 can compare the current approximate decibel level to the preceding determined approximate decibel level or levels to ensure there is continuity between sequential audio frames. In some implementations, the overall smoothing module 324 is a Butterworth filter.

The overall lookup mechanism 326 receives the approximate decibel level (which may or may not be smoothed) and determines the overall attenuation multiplier based thereon. In some implementations, the overall lookup mechanism includes a lookup table that relates decibel values to attenuation multipliers. The attenuation multipliers are between zero and one. The lookup table may be determined in any suitable manner. Examples manners by which a lookup table are determined are discussed in greater detail below. The term "lookup table" may extend to any suitable structures that receive decibel values and output attenuation multipliers such as different types of functions, tables, or graphs.

In some implementations, the bin-by-bin gate 330 includes a plurality of frequency band pipelines (or "pipelines"), where each pipeline corresponds to a different frequency band. In the illustrated example, the bin-by-bin gate divides the frequency domain into four frequency bands. While four frequency bands are shown, the bin-by-bin gate may utilize any number of frequency bands. Each pipeline may include a block extractor 332, a bin-specific decibel approximator 334, and a band-specific lookup mechanism 336 that is configured for the particular frequency band. For example, a first band pipeline may include a first block extractor 332-1, a first bin-specific decibel approximator 334-1, and a first band-specific lookup mechanism 336-1. Similarly, a second band pipeline may include a second block extractor 332-2, a bin-specific decibel approximator 334-2, and a second band-specific lookup mechanism 336-2. In the example, the bin-by-bin gate 330 further includes a third band pipeline that includes a third block extractor 332-3, a third bin-specific decibel approximator 334-3, and a third band-specific lookup mechanism 336-3, and a fourth band pipeline that includes a fourth block extractor 332-4, a fourth bin-specific decibel approximator 334-4, and a fourth-band-specific lookup mechanism 336-4.

Each of the frequency band pipelines may be configured to operate in the same manner as one another. The only difference between each pipeline is that each pipeline utilizes a different band-specific lookup mechanism, such that each band-specific lookup mechanism may be optimized or selected for minimizing the noise floor within a specific range of frequencies. Put another way, each band-specific lookup mechanism is configured to reduce the noise floor from the frequency bins contained in the frequency band to which the band-specific lookup mechanism 336 corresponds. In this way, the multiband noise gate 300 can target complex signals. For example, humans are sensitive to frequency bins that are in the frequency range of human speech (e.g., the second and third frequency bands). As such, the pipelines associated with the higher and lower frequencies (e.g., the first and second frequency band pipelines) may be more aggressive in attenuating the respective portions of the audio signal.

The block extractors 332 extract the portions of the one or more audio streams that are relevant to the frequency band. As discussed, each audio stream is comprised of a sequence of audio frames, where each audio frame corresponds to a brief chunk of the audio stream. Each block extractor 332 receives the one or more audio frames and extracts the magnitude values from the audio frames that correspond to the respective frequency band of the block extractor 332. For instance, the first block extractor 332-1 may extract the magnitudes of the first and second frequency bins from each audio frame, the second block extractor 332-2 may extract the magnitudes of the third, fourth, fifth, and sixth frequency bins of each audio frame, and so on and so forth.

The bin-specific decibel estimators 334 receive the magnitudes for each respective frequency bin in the frequency band and determine an approximate decibel level for each frequency bin. The approximate decibel level at a frequency bin may be an approximation of the average decibel level observed at a frequency bin across the set of audio frames. For example, if the image capture device 110 includes three microphones and the first frequency band includes a first frequency bin and a second frequency bin, the first bin-specific decibel approximator 334-1 may determine an average decibel level for the first frequency bin based on the magnitudes observed in the first frequency bin of each of the three audio signals (and in particular, from three corresponding audio frames). Similarly, the first bin-specific decibel approximator 334-1 may determine an average decibel level for the second frequency bin based on the magnitudes observed in the second frequency bin of each of the three audio signals.

In some implementations, a bin-specific decibel approximator 334 may determine an approximate decibel level based on a root mean square of the magnitudes observed at a particular frequency bin. A bin-specific decibel approximator 334 may determine the approximate decibel level of the frequency bin by determining twenty times the logarithm of the determined root mean square value. For example, in the instance where an image capturing device 110 includes three microphones, the first bin-specific decibel approximator 334-1 may calculate a root mean square of the magnitudes observed in the first bins of a first audio frame from a first audio signal, a second audio frame from a second audio signal, and a third audio frame from a third audio signal, where the first, second, and third audio frames are all time-synchronized. The first bin-specific decibel approximator 334-1 may then determine twenty times the logarithm of the determined root mean square. The result of twenty times the logarithm is the approximate decibel level of the first frequency bin across the three audio signals. The bin-specific decibel approximators 334 may determine the approximate decibel level for each frequency bin in this manner.

The band-specific lookup mechanisms 336 receive an approximate decibel level of a frequency bin and output a bin-specific attenuation multiplier for the frequency bin. The band-specific lookup mechanisms 336 can enter the determined bin-specific attenuation multipliers into an attenuation vector. Each determined bin-specific attenuation multiplier may be a corresponding entry in the attenuation vector, such that the first bin-specific attenuation multiplier is used to attenuate a first frequency bin of an audio signal, a second bin-specific attenuation multiplier is used to attenuate a second bin of an audio signal, and so on and so forth.

As previously mentioned, each band-specific lookup mechanism 336 may optimized to reduce/remove the noise floor from its respective frequency band. FIGS. 4A-4D illustrate examples of band-specific lookup tables 400 that may be implemented in the band-specific lookup mechanisms 336 of FIG. 3D. For instance, FIG. 4A illustrates a first band-specific lookup table 400-1 that may be implemented by the first band-specific lookup mechanism 336-1. Thus, the first band-specific lookup table 400-1 may be used to determine the bin-specific attenuation multipliers for the frequency bins included in the first frequency band. FIG. 4B illustrates a second band-specific lookup table 400-2 that may be implemented by the second band-specific lookup mechanism 336-2. As such, the second band-specific lookup table 400-2 may be used to determine the bin-specific attenuation multipliers for the frequency bins included in the second frequency band. FIG. 4C illustrates a third band-specific lookup table 400-3 that may be implemented by the third band-specific lookup mechanism 336-3. Accordingly, the third band-specific lookup table 400-3 may be used to determine the bin-specific attenuation multipliers for the frequency bins included in the third frequency band. FIG. 4D illustrates a fourth band-specific lookup table 400-4 that may be implemented by the fourth band-specific lookup mechanism 336-4. The fourth band-specific lookup table 400-4 may be used to determine the bin-specific attenuation multipliers for the frequency bins included in the fourth frequency band.

As can be appreciated, each of the band-specific lookup tables 400 behaves differently. For instance, the fourth band-specific lookup table 400-4 relates relatively low attenuation multipliers to decibel levels that are between −140 dB and −100 dB, but then sharply increases. In contrast, the third lookup table 400-3 illustrates a nearly linear increase in attenuation multipliers between −140 dB and −100 dB, then relates a value near or equal to one to decibel levels that are greater than −100 dB. In this example, the noise floor that is observed in the image capturing device 110 may be less observable in the frequencies defined in the third frequency band than the noise floor that is associated with the fourth frequency band. The examples of FIGS. 4A-4D are not intended to be limiting. Furthermore, while four band-specific lookup tables 400 are shown, the bin-by-bin gate may include any number of band-specific lookup tables. The term "lookup table" may extend to any suitable structures that receive decibel values and output attenuation multipliers such as different types of functions, tables, or graphs.

In some implementations, the band-specific lookup tables 400 may be determined empirically. In these implementations, the band-specific lookup tables 400 may be determined for a particular make and model of an image capture device 110. For example, an image capture device 110 may be placed in a sound-tight container, whereby external noises cannot penetrate the sound-tight container. The microphones of the image capture device 110 may be activated to capture audio signals. As the image capture device 110 is in a sound-tight container, the only audio that is captured is the noise produced by the image capture device, which includes the noise floor.

Figure 5A:
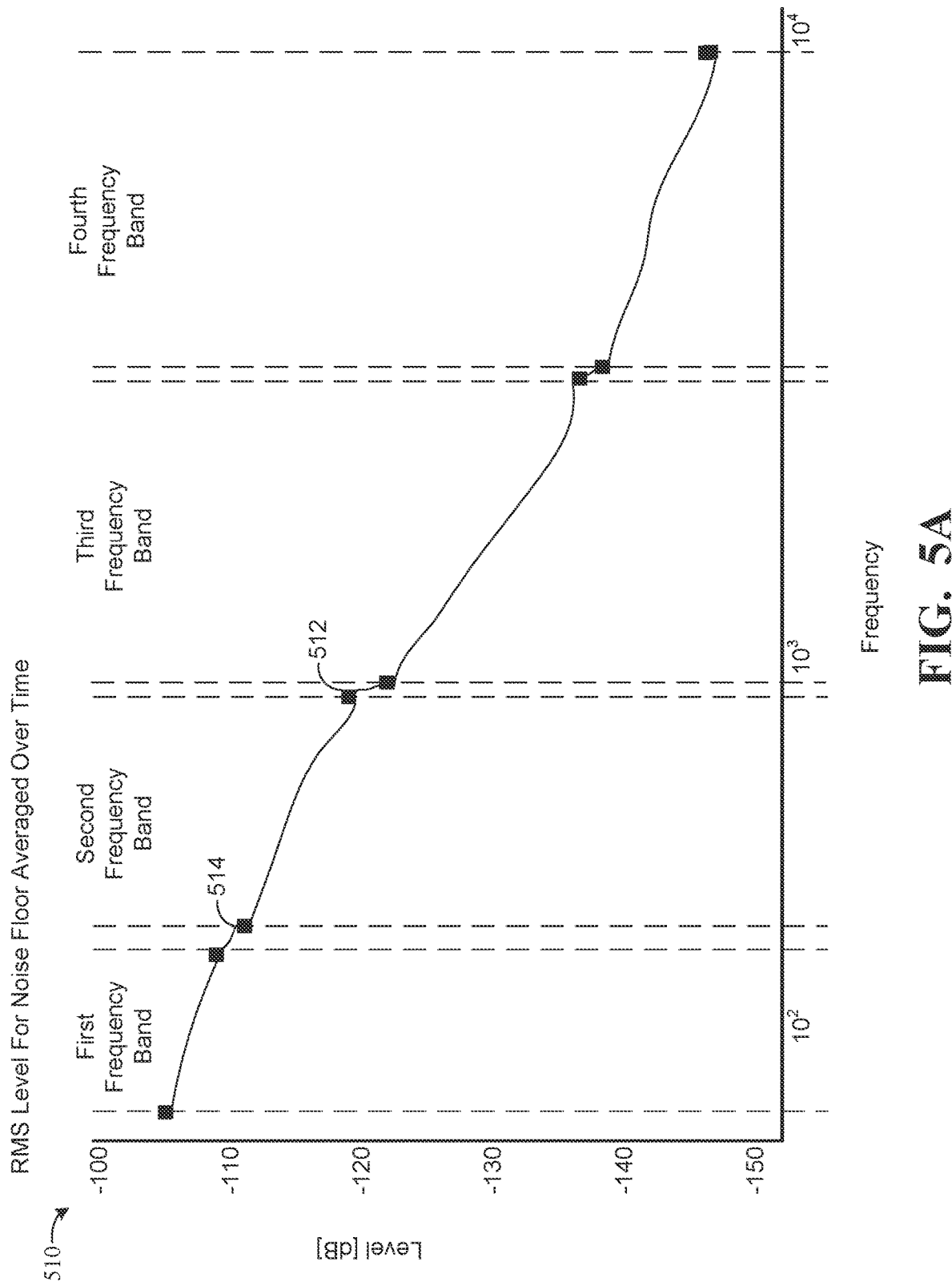
FIGS. 5A and 5B are schematics illustrating examples of captured audio signals in the frequency domain for purposes of empirically determining the different band-specific lookup tables.
Figure 5B:
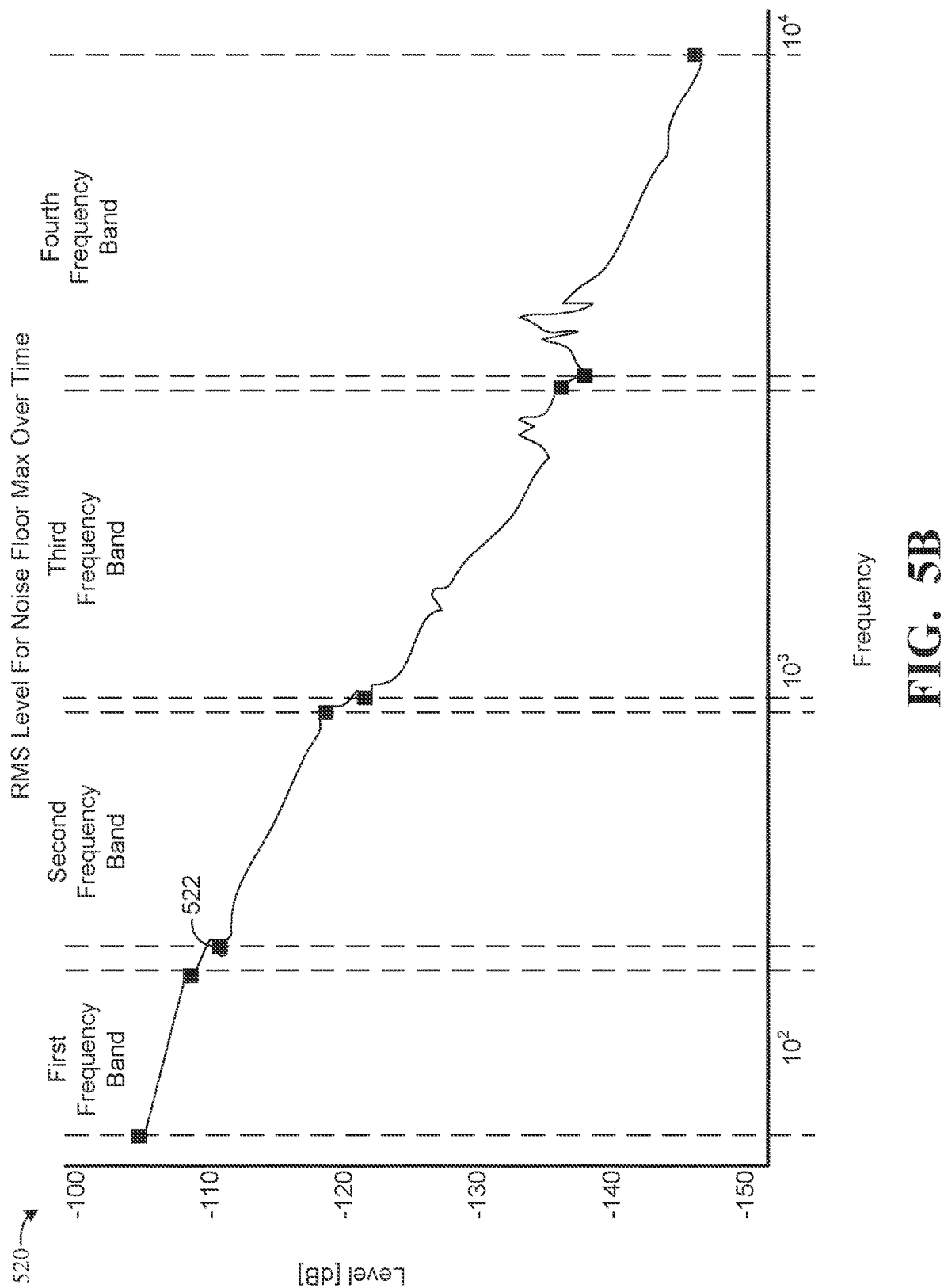

FIGS. 5A and 5B illustrate an example empirical analysis from which the lookup tables may be determined. The analysis may be performed offline and by a device other than the image capture device 110. FIG. 5A is a graph 510 that illustrates the average RMS levels of a plurality of audio signals in the frequency domain. The values for each frequency bin have been averaged over the full length of the recording. FIG. 5B is a graph 520 that illustrates the maximum value observed over the full length of the recording. The values in the graph 520 of FIG. 5B represent the maximum value observed over the full length of the recording. In FIGS. 5A and 5B, the frequency domain is divided into four frequency bands. The highlighted points in FIGS. 5A and B (i.e., data point 512 and data point 514 in FIG. 5A and data point 522 in FIG. 5B)) correspond to the second frequency band and define different points in the band-specific lookup table corresponding to the second frequency band. In determining the lookup table values, the analysis may take into consideration the RMS level of the noise floor, averaged over time, at the highest frequency bin of the band (data point 514). The analysis may also take into consideration the RMS level of the noise floor, averaged over time, at the lowest frequency bin of the band (data point 512). The analysis may also take into consideration the RMS level of the noise floor, maximum over time, at the lowest frequency bin in the band (data point 522). These points are associated with the attenuation multipliers of increasing value. Furthermore, for the lowest frequency band, all the points in the band specific lookup table may be shifted up in level by a predefined amount (e.g., 8 dB or 10 dB), to increase the attenuation under quiet conditions for the lowest frequencies. The foregoing manner by which the band-specific lookup tables are determined is provided for example only. The band-specific lookup tables as well as the overall lookup table may be determined in any other suitable manner.

Figure 6:
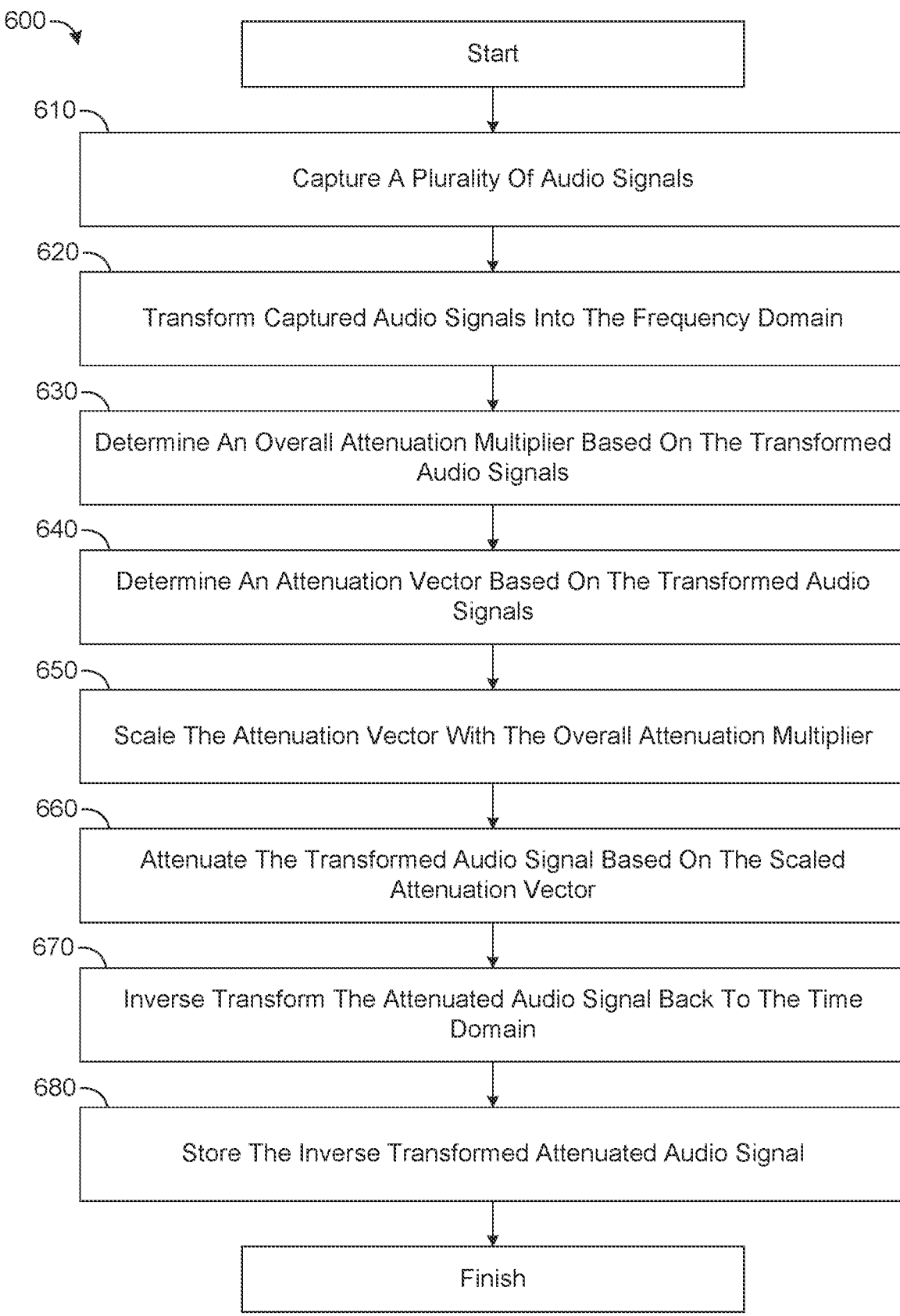
FIG. 6 is a flow chart illustrating an example set of operations of a method for processing audio signals captured by the microphones of an image capture device.

FIG. 6 illustrates an example set of operations of a method 600 for processing audio signals captured by the microphones of an image capture device 110. The method 600 may be performed iteratively for each successive set of audio frames, where each respective audio frame in a set of audio frames is sampled from a different respective audio signal.

At operation 610, the image capture device 110 captures multiple audio signals. The audio signals are captured in the time domain. At operation 620, the transform module 306 transforms each captured audio signal into the frequency domain. In some implementations, the transform module 306 utilizes FFT to transform the audio signals. The output of the transform module 306 may be an ordered series of audio frames, each audio frame being in the frequency domain and representing a brief snapshot of the respective audio signal.

Figure 7:
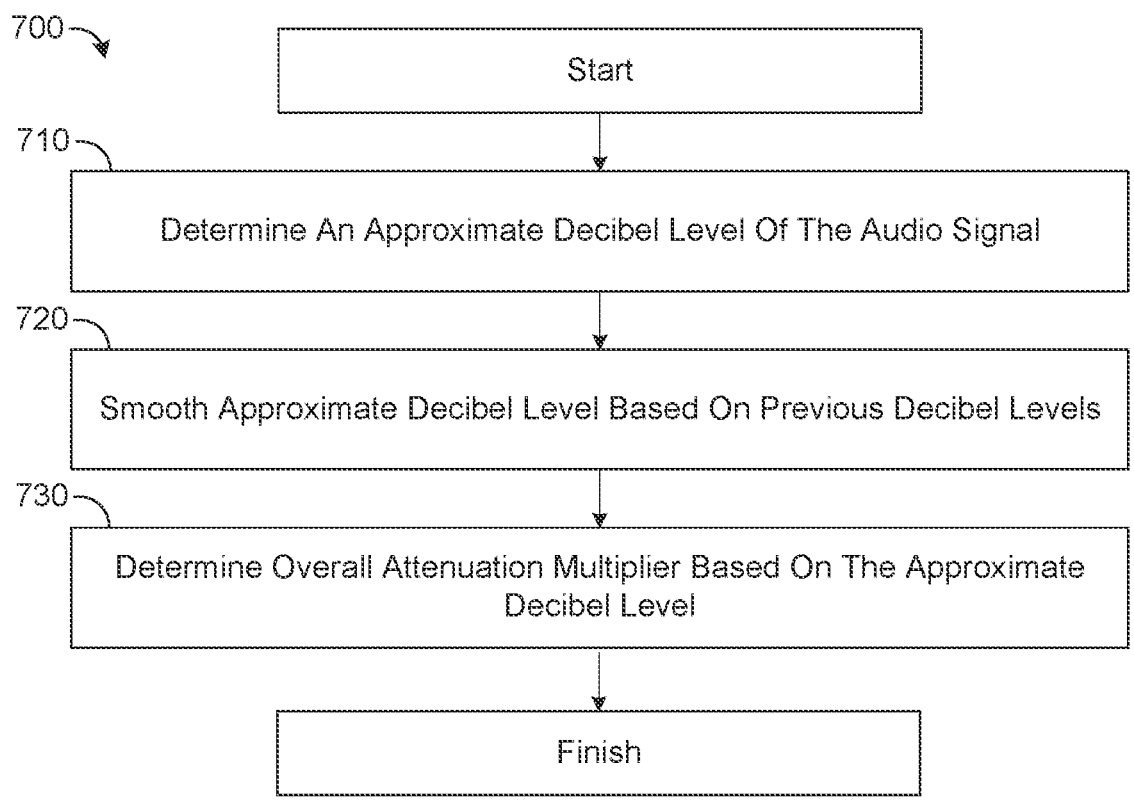
FIG. 7 is a flow chart illustrating an example set of operations of a method for determining an overall attenuation multiplier.

At 630, the multiband noise gate 310 determines an overall attenuation multiplier based on the transformed audio signals. The multiband noise gate 310 determines an overall attenuation multiplier for each set of corresponding audio frames (i.e., audio frames corresponding to the different respective audio signals). Thus, for each snapshot of the audio signals, the multiband noise gate 310 determines a new overall attenuation multiplier. FIG. 7 illustrates an example set of operations of a method for determining an overall attenuation multiplier.

Figure 8:
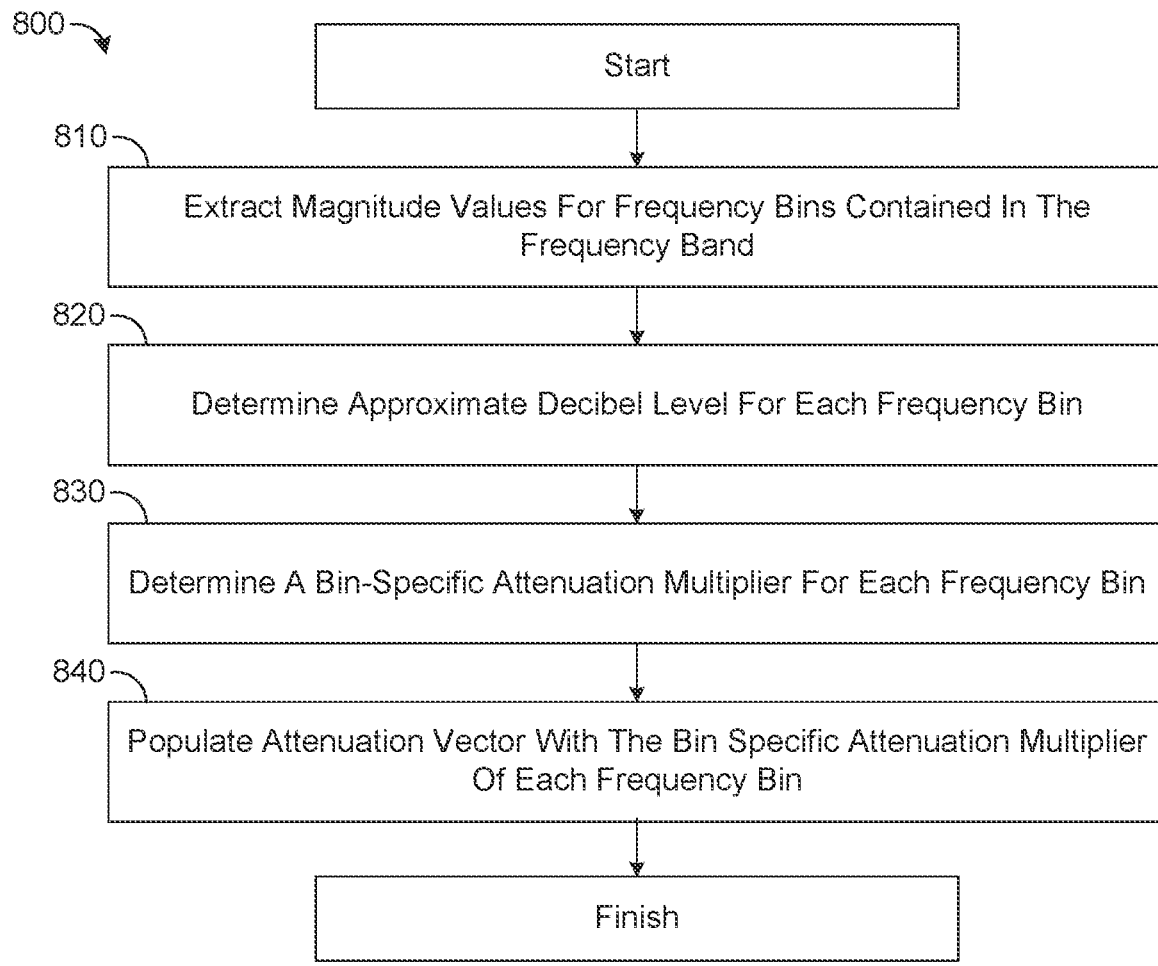
FIG. 8 is a flow chart illustrating an example set of operations of a method for determining an attenuation vector.

At 640, the multiband noise gate 310 determines an attenuation vector based on the transformed audio signals. The multiband noise gate 310 determines a new attenuation vector for each set of corresponding audio frames. FIG. 8 illustrates an example set of operations of a method for determining an attenuation vector. An attenuation vector may include n values, where n is equal to the number of frequency bins in the frequency domain. Each element in the attenuation vector is a different bin-specific attenuation multiplier that corresponds to a respective frequency bin.

At 650, the multiband noise gate 310 scales the attenuation vector with the overall attenuation multiplier. The multiband noise gate 310 may multiply the attenuation vector with the overall attenuation multiplier. Furthermore, in some implementations the multiband noise gate 310 may smooth the scaled attenuation vector. For instance, the multiband noise gate 310 may utilize previously determined attenuation vectors to smooth the scaled bin-specific attenuation vectors in the scaled attenuation vector. In this way, transitions between audio frames are less likely to have audible spikes or dips. At 660, the multiband noise gate 310 attenuates the transformed audio signal based on the scaled attenuation vector. For each audio frame, the multiband noise gate 310 can multiply the magnitude observed each respective frequency bin with the scaled bin-specific attenuation multiplier corresponding to the respective frequency bin.

At 670, the inverse transform module 308 inverse transforms the attenuated audio signals to the time domain. In some implementations, the multiband noise gate 310 applies an IFFT to inverse transform the attenuated signals to the time domain. At 680, the audio processing module 300 may store the resultant processed audio signals in memory.

The method of FIG. 6 may be combined with other audio processing techniques. For example, the audio signals may be filtered or otherwise processed.

FIG. 7 illustrates an example set of operations of a method 700 for determining an overall attenuation multiplier. The method of FIG. 7 assumes that the audio signal is in the frequency domain, and the method 700 is performed on a set of corresponding audio frames.

At 710, the overall gate 320 determines an approximate decibel level of the audio signals (i.e., the set of corresponding audio frames). The overall gate 320 may determine the root mean square (RMS) of all the magnitudes across the entire set of audio frames. The overall gate 320 may then take twenty times the logarithm of the RMS value to determine the approximate decibel level of the audio signal.

At 720, the overall gate 320 smooths the approximate decibel level based on the previous decibel levels. In some implementations, the overall gate 320 utilizes Butterworth filter to smooth the approximate decibel level. The Butterworth filter may utilize previously determined decibel levels to smooth the approximate decibel level.

At 730, the overall gate 320 determines an overall attenuation multiplier based on the smoothed approximated decibel level. The overall gate 320 may determine the overall attenuation multiplier from an overall lookup table. The overall attenuation multiplier is a value between zero and one.

FIG. 8 illustrates an example set of operations of a method 800 for determining an attenuation vector. The description of the method 800 of FIG. 8 assumes that the audio signal is in the frequency domain, and the method 800 is performed on a set of corresponding audio frames. The description assumes n frequency bins distributed amongst m frequency bands, where m and n are integers greater than one and n is greater than or equal to m.

At 810, each block extractor 332 extracts the magnitude values for the frequency bins corresponding to its frequency band. The block extractors 332 may extract the magnitude values from each of the set of audio frames.

At 820, each bin-specific decibel approximator 334 may determine an average decibel level at each frequency bin corresponding to its frequency band. For each frequency bin, the bin-specific decibel approximator 334 may calculate an RMS value of the magnitude values observed at the frequency bin in each of the audio frames. The bin-specific decibel approximator 334 may then calculate twenty times the logarithm of the RMS value to obtain the approximate decibel level at the particular frequency bin. Each bin-specific decibel approximator 334 may calculate the approximate decibel level for each frequency bin contained in the approximator's 334 respective frequency band.

At 830, each band-specific lookup mechanism 336 may determine the bin-specific attenuation multipliers for each frequency bin contained in its respective frequency band. Each band-specific lookup mechanism 336 may utilize a band-specific lookup table 400 to determine the bin-specific attenuation multipliers for the frequency bins contained in its frequency band. Thus, each band-specific lookup mechanism 336 may retrieve, or otherwise obtain, the band-specific lookup table configured for its frequency band. The band-specific lookup mechanism 336 may then lookup the bin-specific attenuation multipliers for each frequency bin in its frequency band. The band-specific lookup mechanism 336 may determine an attenuation multiplier for a frequency bin from the band-specific lookup table using the approximate decibel level of the frequency bin. The band-specific lookup mechanisms 336 can determine the bin-specific attenuation multipliers in this manner for each frequency bin contained in its frequency band. At 840, the band-specific lookup mechanisms 336 can populate an attenuation vector with the bin-specific multipliers of the frequency bins. Each band-specific lookup mechanism 336 can input the determined bin-specific attenuation multipliers in an attenuation vector. Once fully populated, the bin-by-bin gate can output the attenuation vector to the attenuation module.

Where certain elements of these implementations may be partially or fully implemented using known components, those portions of such known components that are necessary for an understanding of the present disclosure have been described, and detailed descriptions of other portions of such known components have been omitted so as not to obscure the disclosure.

In the present specification, an implementation showing a singular component should not be considered limiting; rather, the disclosure is intended to encompass other implementations including a plurality of the same component, and vice-versa, unless explicitly stated otherwise herein.

Further, the present disclosure encompasses present and future known equivalents to the components referred to herein by way of illustration.

As used herein, the term "bus" is meant generally to denote any type of interconnection or communication architecture that may be used to communicate data between two or more entities. The "bus" could be optical, wireless, infrared or another type of communication medium. The exact topology of the bus could be, for example, standard "bus," hierarchical bus, network-on-chip, address-eventrepresentation (AER) connection, or other type of communication topology used for accessing, for example, different memories in a system.

As used herein, the term "computer program" or "software" is meant to include any sequence of human or machine cognizable steps which perform a function. Such program may be rendered in virtually any programming language or environment including, for example, C/C++, C#, Fortran, COBOL, MATLAB™, PASCAL, Python, assembly language, markup languages, such as HTML, Standard Generalized Markup Language (SGML), XML, Voice Markup Language (VoxML), as well as object-oriented environments such as the Common Object Request Broker Architecture (CORBA), Java™ (including J2ME, Java Beans), and/or Binary Runtime Environment, such as Binary Runtime Environment for Wireless (BREW).

As used herein, the terms "integrated circuit," "chip," and "IC" are meant to refer to an electronic circuit manufactured by the patterned diffusion of trace elements into the surface of a thin substrate of semiconductor material. By way of non-limiting example, integrated circuits may include field programmable gate arrays (FPGAs), a programmable logic device (PLD), reconfigurable computer fabrics (RCFs), systems on a chip (SoC), application-specific integrated circuits (ASICs), and/or other types of integrated circuits.

As used herein, the term "memory" includes any type of integrated circuit or other storage device adapted for storing digital data, including, without limitation, read-only memory (ROM), programmable ROM (PROM), electrically erasable PROM (EEPROM), dynamic random access memory (DRAM), Mobile DRAM, synchronous DRAM (SDRAM), Double Data Rate 2 (DDR/2) SDRAM, extended data out (EDO)/fast page mode (FPM), reduced latency DRAM (RLDRAM), static RAM (SRAM), "flash" memory, such as NAND/NOR, memristor memory, and pseudo SRAM (PSRAM).

As used herein, the terms "processor" and "digital processor" are meant generally to include digital processing devices. By way of non-limiting example, digital processing devices may include one or more of digital signal processors (DSPs), reduced instruction set computers (RISC), general-purpose complex instruction set computing (CISC) processors, microprocessors, gate arrays, such as field programmable gate arrays, PLDs, reconfigurable computer fabrics (RCFs), array processors, secure microprocessors, application-specific integrated circuits (ASICs), and/or other digital processing devices. Such digital processors may be contained on a single unitary IC die, or distributed across multiple components.

As used herein, the term "network interface" refers to any signal, data, and/or software interface with a component, network, and/or process. By way of non-limiting example, a network interface may include one or more of FireWire, such as FW400, FW110, and/or other variations, USB, such as USB2, Ethernet, such as 10/100, 10/100/1000 (Gigabit Ethernet, 10-Gig-E, and/or other Ethernet implementations), MoCA, Coaxsys, such as TVnet™, radio frequency tuner, such as in-band or out-of-band, cable modem, and/or other radio frequency tuner protocol interfaces, Wi-Fi (802.11), WiMAX (802.16), personal area network (PAN), such as 802.15, cellular, such as 3G, LTE/LTE-A/TD-LTE, GSM, and/or other cellular technology, IrDA families, and/or other network interfaces.

As used herein, the term "Wi-Fi" includes one or more of IEEE-Std. 802.11, variants of IEEE-Std. 802.11, standards related to IEEE-Std. 802.11, such as 802.11 a/b/g/n/s/v, and/or other wireless standards.

As used herein, the term "wireless" means any wireless signal, data, communication, and/or other wireless interface. By way of non-limiting example, a wireless interface may include one or more of Wi-Fi, Bluetooth, 3G (3GPP/3GPP2), High Speed Downlink Packet Access/High Speed Uplink Packet Access (HSDPA/HSUPA), Time Division Multiple Access (TDMA), Code Division Multiple Access (CDMA)(such as, IS-95A, Wideband CDMA (WCDMA), and/or other wireless technology), Frequency Hopping Spread Spectrum (FHSS), Direct Sequence Spread Spectrum (DSSS), Global System for Mobile communications (GSM), PAN/802.15, WiMAX (802.16), 802.20, narrowband/Frequency Division Multiple Access (FDMA), Orthogonal Frequency Division Multiplex (OFDM), Personal Communication Service (PCS)/Digital Cellular System (DCS), LTE/LTE-Advanced (LTE-A)/Time Division LTE (TD-LTE), analog cellular, cellular Digital Packet Data (CDPD), satellite systems, millimeter wave or microwave systems, acoustic, infrared (i.e., IrDA), and/or other wireless interfaces.

As used herein, the terms "camera," or variations thereof, and "image capture device," or variations thereof, may be used to refer to any imaging device or sensor configured to capture, record, and/or convey still and/or video imagery which may be sensitive to visible parts of the electromagnetic spectrum, invisible parts of the electromagnetic spectrum, such as infrared, ultraviolet, and/or other energy, such as pressure waves.

While certain aspects of the technology are described in terms of a specific sequence of steps of a method, these descriptions are illustrative of the broader methods of the disclosure and may be modified by the particular application. Certain steps may be rendered unnecessary or optional under certain circumstances. Additionally, certain steps or functionality may be added to the disclosed implementations, or the order of performance of two or more steps may be permuted. All such variations are considered to be encompassed within the disclosure.

What is claimed is:

1. An image capture device comprising:
a plurality of audio recording devices configured to capture a plurality of audio signals in a time domain;
a transform circuit configured to transform each audio signal from the time domain to a frequency domain;
a multiband noise gate circuit configured to divide the frequency domain into a plurality of frequency bins that collectively span the frequency domain, wherein each audio signal is represented by a plurality of magnitudes respectively corresponding to the plurality of frequency bins of the frequency domain, wherein each magnitude represents a magnitude of the audio signal at the corresponding frequency bin;
an overall gate circuit configured to determine an overall attenuation multiplier based on the plurality of audio signals and an overall lookup table that relates decibel values to different overall attenuation multipliers;
a bin-by-bin gate circuit configured to determine an attenuation vector comprising a plurality of bin-specific attenuation multipliers, each bin-specific attenuation multiplier respectively corresponding to a different frequency bin of the plurality of frequency bins, wherein the bin-by-bin gate circuit is further configured to:
separate the plurality of audio signals into a plurality of frequency bands, wherein the plurality of frequency bands collectively span the frequency domain, and each respective band is spanned by two or more frequency bins of the plurality of the frequency bins; and for each respective frequency band:
obtain a band-specific lookup table from a plurality of band-specific lookup tables, wherein the band-specific lookup table corresponds to the respective frequency band and relates decibel levels to bin-specific attenuation values;

a bin-specific decibel estimator circuit configured to determine, for each respective frequency bin within the frequency band, an approximate decibel level at the respective frequency bin based on the plurality of audio signals;

a band-specific lookup circuit configured to:
determine, for each respective frequency bin within the frequency band, a bin-specific attenuation multiplier corresponding to the respective frequency bin based on an average decibel level at the respective frequency bin and the respective band-specific lookup table; and
input the bin-specific attenuation multiplier to the attenuation vector; and an attenuation circuit configured to scale each bin-specific attenuation value in the attenuation vector with the overall attenuation multiplier;

wherein the multiband noise gate circuit is further configured to edit each of the audio signals based on the scaled bin-specific attenuation values in the attenuation vector to produce an attenuated audio signal.

2. The image capture device of claim 1, wherein the bin-specific decibel estimator circuit is further configured to:
for each audio signal, determine a complex magnitude at the respective frequency bin;
calculate a root mean square value based on the complex magnitudes at the respective frequency bin; and
calculate a logarithm of the root mean square value to obtain the approximate decibel level at the respective frequency bin.

3. The image capture device of claim 1, wherein the overall gate circuit is further configured to:
determine an approximate decibel value of all of the audio signals of the plurality of audio signals; and
determine the overall attenuation multiplier from the overall lookup table using the approximate decibel value of all of the audio signals.

4. The image capture device of claim 3, wherein the attenuation circuit is configured to multiply the bin-specific attenuation values by the overall attenuation value to scale each of the bin-specific attenuation values.

5. The image capture device of claim 3, wherein the overall gate circuit is further configured to:
smooth the approximate decibel value of all of the audio signals of the plurality of audio signals based on a previously determined approximate decibel level.

6. The image capture device of claim 1, wherein the multiband noise gate circuit is further configured to:
for each respective audio signal and for each respective frequency bin, multiply a magnitude of the respective audio signal at the respective frequency bin by the scaled bin-specific attenuation value.

7. The image capture device of claim 1, wherein the multiband noise gate circuit is further configured to:
smooth the scaled bin-specific attenuation values in the attenuation vector.

8. The image capture device of claim 1, further comprising:
an inverse transform circuit configured to perform an inverse transform of the attenuated audio signal to the time domain; and
a memory configured to store the inverse transformed attenuated audio signal.

9. An audio processing device comprising:
a plurality of audio recording devices configured to capture a plurality of audio signals in a time domain;
a transform circuit configured to transform each audio signal from the time domain to a frequency domain;
a multiband noise gate circuit configured to divide the frequency domain into a plurality of frequency bins that collectively span the frequency domain, wherein each audio signal is represented by a plurality of magnitudes respectively corresponding to the plurality of frequency bins of the frequency domain, wherein each magnitude represents a magnitude of the audio signal at the corresponding frequency bin;
an overall gate circuit configured to determine an overall attenuation multiplier based on the plurality of audio signals and an overall lookup table that relates decibel values to different overall attenuation multipliers;
a bin-by-bin gate circuit configured to determine an attenuation vector comprising a plurality of bin-specific attenuation multipliers, each bin-specific attenuation multiplier respectively corresponding to a different frequency bin of the plurality of frequency bins, wherein the bin-by-bin gate circuit is further configured to:
separate the plurality of audio signals into a plurality of frequency bands; and
for each respective frequency band:
obtain a band-specific lookup table from a plurality of band-specific lookup tables, wherein the band-specific lookup table corresponds to the respective frequency band and relates decibel levels to bin-specific attenuation values;

a bin-specific decibel estimator circuit configured to determine, for each respective frequency bin within the frequency band, an approximate decibel level at the respective frequency bin based on the plurality of audio signals;

a band-specific lookup circuit configured to:
determine a bin-specific attenuation multiplier corresponding to the respective frequency bin based on an average decibel level at the respective frequency bin and the respective band-specific lookup table; and
input the bin-specific attenuation multiplier to the attenuation vector; and an attenuation circuit configured to scale each bin-specific attenuation value in the attenuation vector with the overall attenuation multiplier;

wherein the multiband noise gate circuit is further configured to edit each of the audio signals based on the bin-specific attenuation values in the attenuation vector to produce an attenuated audio signal.

10. The audio processing device of claim 9, wherein the bin specific decibel estimator circuit is further configured to:
for each audio signal, determine a complex magnitude at the respective frequency bin;
calculate a root mean square value based on the complex magnitudes at the respective frequency bin; and
calculate a logarithm of the root mean square value to obtain the approximate decibel level at the respective frequency bin.

11. The audio processing device of claim 9, further comprising:
    an inverse transform circuit configured to perform an inverse transform of the attenuated audio signal to the time domain; and
    a memory configured to store the inverse transformed attenuated audio signal.

12. The audio processing device of claim 11, wherein the inverse transform is an inverse Fast Fourier Transform (IFFT) or an inverse Laplace transform.

13. A method for processing a plurality of audio signals comprising:
    determining an overall attenuation multiplier based on the plurality of audio signals and by using an overall lookup table that relates decibel values to different overall attenuation multipliers;
    determining an attenuation vector comprising a plurality of bin-specific attenuation multipliers, each bin-specific attenuation multiplier respectively corresponding to a different frequency bin of a plurality of frequency bins, wherein determining the attenuation vector includes:
        separating the plurality of audio signals into a plurality of frequency bands; and
        for each respective frequency band:
            obtaining a band-specific lookup table from a plurality of band-specific lookup tables, wherein the band-specific lookup table corresponds to the respective frequency band and relates decibel levels to bin-specific attenuation values;
            wherein a number of the plurality of frequency bins for each respective frequency band is variable, determining a bin-specific attenuation multiplier corresponding to a respective frequency bin based on an average decibel level at the respective frequency bin and the respective band-specific lookup table; and
            inputting the bin-specific attenuation multiplier to the attenuation vector;
    scaling each bin-specific attenuation value in the attenuation vector with the overall attenuation multiplier; and
    editing each of the audio signals based on the bin-specific attenuation values in the attenuation vector to produce an attenuated audio signal.

14. The method of claim 13, wherein the plurality of frequency bands collectively span a frequency domain.

15. The method of claim 13, wherein each respective frequency band is spanned by two or more frequency bins of the plurality of frequency bins.

16. The method of claim 13, wherein determining the overall attenuation multiplier comprises:
    determining an approximate decibel value of all of the audio signals of the plurality of audio signals; and
    determining the overall attenuation multiplier from the overall lookup table using the approximate decibel value of all of the audio signals.

17. The method of claim 16, wherein the overall attenuation multiplier is a value between zero and one.

18. The method of claim 17, wherein scaling each of the bin-specific attenuation values based on the overall attenuation value includes multiplying the bin-specific attenuation values by the overall attenuation value.

19. The method of claim 13, wherein each bin-specific attenuation multiplier is between zero and one.

20. The method of claim 13, wherein each band-specific lookup table is based on a root mean square level of a noise floor, averaged over time.

\* \* \* \* \*

UNITED STATES PATENT AND TRADEMARK OFFICE
CERTIFICATE OF CORRECTION

| | |
|---|---|
| PATENT NO. | : 11,688,409 B2 |
| APPLICATION NO. | : 17/093223 |
| DATED | : June 27, 2023 |
| INVENTOR(S) | : Joyce Gorny, Erich Tisch and Per Magnus Fredrik Hansson |

It is certified that error appears in the above-identified patent and that said Letters Patent is hereby corrected as shown below:

On the Title Page

Line 3 of the Item (57) Abstract:
Replace "determining" with --determines--

Signed and Sealed this
Thirtieth Day of July, 2024

Katherine Kelly Vidal
*Director of the United States Patent and Trademark Office*